(12) United States Patent
Ogura et al.

(10) Patent No.: US 9,368,383 B2
(45) Date of Patent: Jun. 14, 2016

(54) SUBSTRATE TREATING APPARATUS WITH SUBSTRATE REORDERING

(71) Applicant: SOKUDO Co., Ltd., Kyoto (JP)

(72) Inventors: Hiroyuki Ogura, Kyoto (JP); Tsuyoshi Mitsuhashi, Kyoto (JP); Yoshiteru Fukutomi, Kyoto (JP); Kenya Morinishi, Kyoto (JP); Yasuo Kawamatsu, Kyoto (JP); Hiromichi Nagashima, Kyoto (JP)

(73) Assignee: SCREEN SEMICONDUCTOR SOLUTIONS CO., LTD., Kyoto (JP)

( * ) Notice: Subject to any disclaimer, the term of this patent is extended or adjusted under 35 U.S.C. 154(b) by 132 days.

(21) Appl. No.: 14/447,409

(22) Filed: Jul. 30, 2014

(65) Prior Publication Data

US 2014/0342558 A1     Nov. 20, 2014

Related U.S. Application Data

(63) Continuation of application No. 12/343,302, filed on Dec. 23, 2008, now abandoned.

(30) Foreign Application Priority Data

Dec. 28, 2007   (JP) ................. 2007-340427

(51) Int. Cl.
*H01L 21/677*     (2006.01)
*H01L 21/67*      (2006.01)
(52) U.S. Cl.
CPC ...... *H01L 21/67745* (2013.01); *H01L 21/6715* (2013.01); *H01L 21/6776* (2013.01); *H01L 21/67178* (2013.01); *H01L 21/67276* (2013.01); *H01L 21/67754* (2013.01)
(58) Field of Classification Search
CPC ...... H01L 21/677–21/67781; H01L 21/67259; H01L 21/67271; H01L 21/67276; H01L 21/67242–21/67294
See application file for complete search history.

(56) References Cited

U.S. PATENT DOCUMENTS 4,409,889 A   10/1983   Burleson
4,985,722 A    1/1991   Ushijima et al.
(Continued)

FOREIGN PATENT DOCUMENTS

CN         1773672      5/2006
JP      H01-241840 A1   9/1989
(Continued)

OTHER PUBLICATIONS

Trial for Patent Invalidation for corresponding Korean Patent Application No. 10-1432358 dated Nov. 18, 2014, 54 pages. (English Translation is not available).
(Continued)

*Primary Examiner* — Alex A Rolland
(74) *Attorney, Agent, or Firm* — Kipatrick Townsend & Stockton LLP

(57) ABSTRACT

A treating section has substrate treatment lines arranged one over the other for treating substrates while transporting the substrates substantially horizontally. An IF section transports the substrates fed from each substrate treatment line to an exposing machine provided separately from this apparatus. The substrates are transported to the exposing machine in the order in which the substrates are loaded into the treating section. The throughput of this apparatus can be improved greatly, without increasing the footprint, since the substrate treatment lines are arranged one over the other. Each substrate can be controlled easily since the order of the substrates transported to the exposing machine is in agreement with the order of the substrates loaded into the treating section.

15 Claims, 17 Drawing Sheets

(56) References Cited

U.S. PATENT DOCUMENTS

| | | |
|---|---|---|
| 5,028,195 A | 7/1991 | Ishii et al. |
| 5,100,516 A | 3/1992 | Nishimura et al. |
| 5,102,283 A | 4/1992 | Balzola Elora |
| 5,177,514 A | 1/1993 | Ushijima et al. |
| 5,202,716 A | 4/1993 | Tateyama et al. |
| 5,275,709 A | 1/1994 | Anderle et al. |
| 5,297,910 A | 3/1994 | Yoshioka et al. |
| 5,430,271 A | 7/1995 | Orgami et al. |
| 5,518,542 A | 5/1996 | Matsukawa et al. |
| 5,536,128 A | 7/1996 | Shimoyashiro et al. |
| 5,565,034 A | 10/1996 | Nanbu et al. |
| 5,571,325 A | 11/1996 | Ueyama et al. |
| 5,651,823 A | 7/1997 | Parodi et al. |
| 5,664,254 A | 9/1997 | Ohkura et al. |
| 5,668,056 A | 9/1997 | Wu et al. |
| 5,668,733 A | 9/1997 | Morimoto et al. |
| 5,672,205 A | 9/1997 | Fujitmoto et al. |
| 5,677,758 A | 10/1997 | McEachern et al. |
| 5,725,664 A | 3/1998 | Nanbu et al. |
| 5,788,447 A | 8/1998 | Yonemitsu et al. |
| 5,788,868 A | 8/1998 | Itaba et al. |
| 5,803,932 A | 9/1998 | Akimoto et al. |
| 5,820,679 A | 10/1998 | Yokoyama et al. |
| 5,826,129 A | 10/1998 | Hasebe et al. |
| 5,842,917 A | 12/1998 | Soung et al. |
| 5,844,662 A | 12/1998 | Akimoto et al. |
| 5,858,863 A | 1/1999 | Yokoyama et al. |
| 5,876,280 A | 3/1999 | Kitano et al. |
| 5,928,390 A | 7/1999 | Yaeggashi et al. |
| 5,937,223 A | 8/1999 | Akimoto et al. |
| 5,963,753 A | 10/1999 | Ohtani et al. |
| 5,972,110 A | 10/1999 | Akimoto |
| 5,976,199 A | 11/1999 | Wu et al. |
| 6,007,629 A | 12/1999 | Ohtani et al. |
| 6,010,570 A | 1/2000 | Motoda et al. |
| 6,027,262 A | 2/2000 | Akimoto |
| 6,062,798 A | 5/2000 | Muka |
| 6,063,439 A | 5/2000 | Semba et al. |
| 6,099,598 A | 8/2000 | Yokoyama et al. |
| 6,099,643 A | 8/2000 | Ohtani et al. |
| 6,116,841 A | 9/2000 | Iwasaki |
| 6,146,083 A | 11/2000 | Iwasaki |
| 6,151,981 A | 11/2000 | Costa |
| 6,161,969 A | 12/2000 | Kimura et al. |
| 6,176,667 B1 | 1/2001 | Fairbairn et al. |
| 6,210,481 B1 | 4/2001 | Sakai et al. |
| 6,227,786 B1 | 5/2001 | Tateyama |
| 6,235,634 B1 | 5/2001 | White et al. |
| 6,264,748 B1 | 7/2001 | Kuriki et al. |
| 6,266,125 B1 | 7/2001 | Fukuda et al. |
| 6,270,306 B1 | 8/2001 | Otwell et al. |
| 6,287,023 B1 | 9/2001 | Yaegashi et al. |
| 6,287,025 B1 | 9/2001 | Matsuyama |
| 6,290,405 B1 | 9/2001 | Ueda |
| 6,333,003 B1 | 12/2001 | Katano et al. |
| 6,338,582 B1 | 1/2002 | Ueda |
| 6,377,329 B1 | 4/2002 | Takekuma |
| 6,382,895 B1 | 5/2002 | Konishi et al. |
| 6,402,401 B1 | 6/2002 | Ueda et al. |
| 6,426,303 B1 | 7/2002 | Ueda |
| 6,432,842 B2 | 8/2002 | Akimoto et al. |
| 6,444,029 B1 | 9/2002 | Kimura et al. |
| 6,454,472 B1 | 9/2002 | Kim et al. |
| 6,461,438 B1 | 10/2002 | Ookura et al. |
| 6,464,789 B1 | 10/2002 | Akimoto |
| 6,466,300 B1 | 10/2002 | Deguchi |
| 6,485,203 B2 | 11/2002 | Katano et al. |
| 6,491,451 B1 | 12/2002 | Stanley et al. |
| 6,511,315 B2 | 1/2003 | Hashimoto |
| 6,537,835 B2 | 3/2003 | Adachi et al. |
| 6,558,053 B2 | 5/2003 | Shigemori et al. |
| 6,590,634 B1 | 7/2003 | Nishi et al. |
| 6,680,775 B1 | 1/2004 | Hirikawa |
| 6,698,944 B2 | 3/2004 | Fujita |
| 6,750,155 B2 | 6/2004 | Halsey et al. |
| 6,752,543 B2 | 6/2004 | Fukutomi et al. |
| 6,752,872 B2 | 6/2004 | Inada et al. |
| 6,758,647 B2 | 7/2004 | Kaji et al. |
| 6,807,455 B2 | 10/2004 | Yoshida et al. |
| 6,832,863 B2 | 12/2004 | Sugimoto et al. |
| 6,879,866 B2 | 4/2005 | Tel et al. |
| 6,889,014 B2 | 5/2005 | Takano |
| 6,893,171 B2 | 5/2005 | Fukutomi et al. |
| 6,910,497 B2 | 6/2005 | Bernad |
| 6,919,001 B2 | 7/2005 | Fairbairn et al. |
| 6,937,917 B2 | 8/2005 | Akiyama et al. |
| 6,955,595 B2 | 10/2005 | Kim |
| 6,982,102 B2 | 1/2006 | Inada et al. |
| 7,001,674 B2 | 2/2006 | Irie |
| 7,008,124 B2 | 3/2006 | Miyata |
| 7,017,658 B2 | 3/2006 | Hisai et al. |
| 7,053,990 B2 | 5/2006 | Galburt et al. |
| 7,069,099 B2 | 6/2006 | Hashinoki et al. |
| 7,072,730 B2 | 7/2006 | Kobayashi et al. |
| 7,241,061 B2 | 7/2007 | Akimoto et al. |
| 7,245,348 B2 | 7/2007 | Akimoto et al. |
| 7,262,829 B2 | 8/2007 | Hayashida et al. |
| 7,279,067 B2 | 10/2007 | Yoshida et al. |
| 7,281,869 B2 | 10/2007 | Akimoto et al. |
| 7,317,961 B2 | 1/2008 | Hashinoki et al. |
| 7,322,756 B2 | 1/2008 | Akimoto et al. |
| 7,323,060 B2 | 1/2008 | Yamada et al. |
| 7,335,090 B2 | 2/2008 | Takahashi |
| 7,497,633 B2 | 3/2009 | Kaneyama et al. |
| 7,522,823 B2 | 4/2009 | Fukimoto et al. |
| 7,525,650 B2 | 4/2009 | Shiga et al. |
| 7,537,401 B2 | 5/2009 | Kim et al. |
| 7,549,811 B2 | 6/2009 | Yamada et al. |
| 7,563,042 B2 | 7/2009 | Nakaharada et al. |
| 7,604,424 B2 | 10/2009 | Shigemori et al. |
| 7,641,405 B2 | 1/2010 | Fukutomi |
| 7,641,406 B2 | 1/2010 | Nishimura et al. |
| 7,645,081 B2 | 1/2010 | Hara et al. |
| 7,651,306 B2 | 1/2010 | Rice et al. |
| 7,652,276 B2 | 1/2010 | Hayakawa et al. |
| 7,661,894 B2 | 2/2010 | Matsuoka et al. |
| 7,675,048 B2 | 3/2010 | Binns et al. |
| 7,686,559 B2 | 3/2010 | Tsujimoto et al. |
| 7,692,764 B2 | 4/2010 | Shirata |
| 7,699,021 B2 | 4/2010 | Volfovski et al. |
| 7,729,798 B2 | 6/2010 | Hayashida et al. |
| 7,758,341 B2 | 7/2010 | Dong-Hun |
| 7,801,633 B2 | 9/2010 | Yamamoto et al. |
| 7,809,460 B2 | 10/2010 | Ishida et al. |
| 7,819,079 B2 | 10/2010 | Englhardt et al. |
| 7,836,845 B2 | 11/2010 | Tanoue et al. |
| 7,841,072 B2 | 11/2010 | Matsuoka et al. |
| 7,871,211 B2 | 1/2011 | Matsuoka et al. |
| 7,905,668 B2 | 3/2011 | Yamamoto |
| 7,925,377 B2 | 4/2011 | Ishikawa et al. |
| 7,934,880 B2 | 5/2011 | Hara et al. |
| 8,025,023 B2 | 9/2011 | Hayashida et al. |
| 8,034,190 B2 | 10/2011 | Yasuda et al. |
| 8,113,141 B2 | 2/2012 | Oh |
| 8,113,142 B2 | 2/2012 | Oh |
| 8,154,106 B2 | 4/2012 | Ishida et al. |
| 8,220,354 B2 | 7/2012 | Todorov |
| 8,268,384 B2 | 9/2012 | Matshuoka et al. |
| 8,289,496 B2 | 10/2012 | Kim et al. |
| 8,342,761 B2 | 1/2013 | Matsuoka |
| 8,353,986 B2 | 1/2013 | Sasaski et al. |
| 8,419,341 B2 | 4/2013 | Hoey et al. |
| 8,443,513 B2 | 5/2013 | Ishida et al. |
| 8,480,319 B2 | 7/2013 | Hayashi et al. |
| 8,545,118 B2 | 10/2013 | Ogura et al. |
| 8,560,108 B2 | 10/2013 | Matsuyana et al. |
| 8,588,950 B2 | 11/2013 | Nomura |
| 8,612,807 B2 | 12/2013 | Collins, Jr. |
| 8,631,809 B2 | 1/2014 | Hamada et al. |
| 8,708,587 B2 | 4/2014 | Ogura et al. |
| 8,731,701 B2 | 5/2014 | Tsukinoki et al. |
| 8,851,008 B2 | 10/2014 | Fukutomi et al. |
| 2001/0013161 A1 | 8/2001 | Kitano et al. |
| 2001/0013515 A1 | 8/2001 | Harada et al. |

(56) References Cited

U.S. PATENT DOCUMENTS

| | | |
|---|---|---|
| 2001/0031147 A1 | 10/2001 | Takamori et al. |
| 2002/0011207 A1 | 1/2002 | Uzawa et al. |
| 2002/0048509 A1 | 4/2002 | Sakata et al. |
| 2002/0053319 A1 | 5/2002 | Nagamine |
| 2003/0079957 A1 | 5/2003 | Otaguro et al. |
| 2003/0098966 A1 | 5/2003 | Korenaga et al. |
| 2003/0131458 A1 | 7/2003 | Wang et al. |
| 2003/0147643 A1* | 8/2003 | Miyata .................. G03D 3/00 396/564 |
| 2003/0213431 A1* | 11/2003 | Fukutomi et al. . H01L 21/67173 118/696 |
| 2003/0216053 A1 | 11/2003 | Miyata |
| 2003/0217695 A1 | 11/2003 | Fukutomi et al. |
| 2004/0005149 A1 | 1/2004 | Sugimoto et al. |
| 2004/0007176 A1 | 1/2004 | Janakiraman et al. |
| 2004/0050321 A1 | 3/2004 | Kitano et al. |
| 2004/0061065 A1 | 4/2004 | Hashimoto et al. |
| 2004/0122545 A1 | 6/2004 | Akiyama et al. |
| 2004/0182318 A1 | 9/2004 | Hashinoki et al. |
| 2004/0229441 A1 | 11/2004 | Sugimoto et al. |
| 2005/0030511 A1 | 2/2005 | Auer-Jongepier et al. |
| 2005/0042555 A1 | 2/2005 | Matsushita et al. |
| 2005/0061441 A1 | 3/2005 | Hashinoki et al. |
| 2005/0069400 A1 | 3/2005 | Dickey et al. |
| 2005/0135905 A1 | 6/2005 | Moriya et al. |
| 2005/0266323 A1 | 12/2005 | Raulea |
| 2006/0011296 A1 | 1/2006 | Higashi et al. |
| 2006/0024446 A1 | 2/2006 | Sugimoto et al. |
| 2006/0028630 A1 | 2/2006 | Akimoto |
| 2006/0062282 A1 | 3/2006 | Wright |
| 2006/0090849 A1 | 5/2006 | Toyoda et al. |
| 2006/0098978 A1 | 5/2006 | Yasuda et al. |
| 2006/0104635 A1 | 5/2006 | Kaneyama et al. |
| 2006/0134330 A1 | 6/2006 | Ishikawa et al. |
| 2006/0137726 A1 | 6/2006 | Sano et al. |
| 2006/0147202 A1 | 7/2006 | Yasuda et al. |
| 2006/0162858 A1 | 7/2006 | Akimoto et al. |
| 2006/0164613 A1 | 7/2006 | Akimoto et al. |
| 2006/0194445 A1 | 8/2006 | Hayashi et al. |
| 2006/0201423 A1 | 9/2006 | Akimoto et al. |
| 2006/0201615 A1 | 9/2006 | Matsuoka et al. |
| 2006/0219171 A1 | 10/2006 | Sasaki et al. |
| 2006/0286300 A1 | 12/2006 | Ishikawa et al. |
| 2007/0048979 A1 | 3/2007 | Fukuoka et al. |
| 2007/0056514 A1 | 3/2007 | Akimoto et al. |
| 2007/0058147 A1 | 3/2007 | Hamada |
| 2007/0128529 A1 | 6/2007 | Kazaana |
| 2007/0172234 A1 | 7/2007 | Shigemori et al. |
| 2007/0179658 A1 | 8/2007 | Hamada |
| 2007/0190437 A1 | 8/2007 | Kaneyama et al. |
| 2007/0219660 A1 | 9/2007 | Kaneko et al. |
| 2007/0274711 A1 | 11/2007 | Kaneyama et al. |
| 2007/0280680 A1 | 12/2007 | Kim et al. |
| 2007/0297794 A1 | 12/2007 | Park et al. |
| 2008/0014333 A1 | 1/2008 | Matsuoka et al. |
| 2008/0026153 A1 | 1/2008 | Hayashida et al. |
| 2008/0037013 A1 | 2/2008 | Yamamoto et al. |
| 2008/0070164 A1 | 3/2008 | Hayashida et al. |
| 2008/0129968 A1 | 6/2008 | Hayashida et al. |
| 2008/0158531 A1 | 7/2008 | Kiuchi |
| 2008/0212049 A1 | 9/2008 | Fukutomi et al. |
| 2008/0224817 A1 | 9/2008 | Vellore et al. |
| 2008/0269937 A1 | 10/2008 | Yamamoto |
| 2008/0304940 A1 | 12/2008 | Auer-Jongepier et al. |
| 2009/0000543 A1 | 1/2009 | Fukutomi et al. |
| 2009/0001071 A1 | 1/2009 | Kulkarni |
| 2009/0014126 A1 | 1/2009 | Ohtani et al. |
| 2009/0018686 A1 | 1/2009 | Yamamoto et al. |
| 2009/0044747 A1 | 2/2009 | Nishimura |
| 2009/0060480 A1 | 3/2009 | Herchen |
| 2009/0070946 A1 | 3/2009 | Tamada et al. |
| 2009/0098298 A1 | 4/2009 | Miyata et al. |
| 2009/0139450 A1 | 6/2009 | Ogura et al. |
| 2009/0139833 A1 | 6/2009 | Ogura |
| 2009/0142162 A1 | 6/2009 | Ogura et al. |
| 2009/0142713 A1 | 6/2009 | Yamamoto |
| 2009/0143903 A1 | 6/2009 | Blust et al. |
| 2009/0149982 A1 | 6/2009 | Higashi et al. |
| 2009/0165711 A1 | 7/2009 | Ogura et al. |
| 2009/0165712 A1 | 7/2009 | Ogura et al. |
| 2009/0165950 A1 | 7/2009 | Kim et al. |
| 2009/0247053 A1 | 10/2009 | Lee |
| 2009/0291558 A1 | 11/2009 | Kim et al. |
| 2010/0050940 A1 | 3/2010 | Sahoda et al. |
| 2010/0061718 A1 | 3/2010 | Hara et al. |
| 2010/0126527 A1 | 5/2010 | Hamada |
| 2010/0136257 A1 | 6/2010 | Yasuda et al. |
| 2010/0183807 A1 | 7/2010 | Kim |
| 2010/0191362 A1 | 7/2010 | Tsukinoki |
| 2010/0192844 A1 | 8/2010 | Kim et al. |
| 2010/0195066 A1 | 8/2010 | Kim et al. |
| 2011/0043773 A1 | 2/2011 | Matsuoka |
| 2011/0063588 A1 | 3/2011 | Kashiyama et al. |
| 2011/0078898 A1 | 4/2011 | Ishida et al. |
| 2011/0082579 A1 | 4/2011 | Yoshida et al. |
| 2011/0208344 A1 | 8/2011 | Matsuyama et al. |
| 2011/0211825 A1 | 9/2011 | Matsuoka et al. |
| 2011/0242508 A1 | 10/2011 | Kobayashi |
| 2011/0276166 A1 | 11/2011 | Atanasoff |
| 2011/0297085 A1 | 12/2011 | Matsuyama et al. |
| 2012/0013730 A1 | 1/2012 | Koga |
| 2012/0013859 A1 | 1/2012 | Matsuoka et al. |
| 2012/0015307 A1 | 1/2012 | Matsuoka et al. |
| 2012/0029687 A1 | 2/2012 | Hagen et al. |
| 2012/0073461 A1 | 3/2012 | Terada et al. |
| 2012/0084059 A1 | 4/2012 | Akada |
| 2012/0086142 A1 | 4/2012 | Terada et al. |
| 2012/0097336 A1 | 4/2012 | Terada et al. |
| 2012/0135148 A1 | 5/2012 | Deguchi et al. |
| 2012/0145073 A1 | 6/2012 | Fukutomii et al. |
| 2012/0145074 A1 | 6/2012 | Fukutomii et al. |
| 2012/0156380 A1 | 6/2012 | Fukutomii et al. |
| 2012/0271444 A1 | 10/2012 | Matsumoto |
| 2012/0307217 A1 | 12/2012 | Kim et al. |
| 2014/0000514 A1 | 1/2014 | Ogura et al. |
| 2014/0003891 A1 | 1/2014 | Kobayashi |
| 2014/0152966 A1 | 6/2014 | Hwang et al. |
| 2016/0008841 A1 | 1/2016 | Ogura et al. |

FOREIGN PATENT DOCUMENTS

| | | |
|---|---|---|
| JP | H04-085812 A1 | 3/1992 |
| JP | H-085812 A1 | 3/1992 |
| JP | H06-5689 A1 | 1/1994 |
| JP | H06-89934 A1 | 10/1995 |
| JP | H07-283094 A1 | 10/1995 |
| JP | H08-162514 A1 | 6/1996 |
| JP | H09-045613 A1 | 2/1997 |
| JP | H9-148240 A1 | 6/1997 |
| JP | 09-199568 | 7/1997 |
| JP | H09-251953 A1 | 9/1997 |
| JP | 09-312323 A1 | 12/1997 |
| JP | H10-50794 A1 | 2/1998 |
| JP | H10-74822 A1 | 3/1998 |
| JP | H10-144673 A1 | 5/1998 |
| JP | 10-146744 A1 | 6/1998 |
| JP | 10-209241 | 7/1998 |
| JP | H10-189420 A1 | 7/1998 |
| JP | H10-261689 A1 | 9/1998 |
| JP | H10-294351 A1 | 11/1998 |
| JP | H10-335415 A1 | 12/1998 |
| JP | H11-16978 A1 | 1/1999 |
| JP | H11-3851 A | 6/1999 |
| JP | H11-251405 A1 | 9/1999 |
| JP | 11-340301 A | 12/1999 |
| JP | 2000-012443 A1 | 1/2000 |
| JP | 2000-049089 A1 | 2/2000 |
| JP | 2000-100886 A1 | 4/2000 |
| JP | 2000-124124 A1 | 4/2000 |
| JP | 2000-124129 A1 | 4/2000 |
| JP | 2000-200822 A1 | 7/2000 |

(56) References Cited

FOREIGN PATENT DOCUMENTS

| | | |
|---|---|---|
| JP | 2000-269297 A1 | 9/2000 |
| JP | 2000-331922 | 11/2000 |
| JP | 2001-093827 A1 | 6/2001 |
| JP | 2001-176792 A1 | 6/2001 |
| JP | 03-211749 A | 9/2001 |
| JP | 2002-510141 A1 | 2/2002 |
| JP | 2003-059810 A1 | 2/2003 |
| JP | 2003-224175 A1 | 8/2003 |
| JP | 2003-309160 A1 | 10/2003 |
| JP | 2003-324059 A1 | 11/2003 |
| JP | 2003-324139 | 11/2003 |
| JP | 2003-338496 A1 | 11/2003 |
| JP | 10-2004-31921 A1 | 1/2004 |
| JP | 2004-15021 A1 | 1/2004 |
| JP | 2004-015023 A1 | 1/2004 |
| JP | 2004-087675 | 3/2004 |
| JP | 2004-046450 | 5/2004 |
| JP | 2004-152801 A1 | 5/2004 |
| JP | 2004-193597 A | 7/2004 |
| JP | 2004-200485 A1 | 7/2004 |
| JP | 2004-207279 A1 | 7/2004 |
| JP | 2004-241319 A1 | 8/2004 |
| JP | 2004-260129 | 9/2004 |
| JP | 3600711 | 9/2004 |
| JP | 2004-304003 A1 | 10/2004 |
| JP | 2004-311714 A1 | 11/2004 |
| JP | 2004-319767 A1 | 11/2004 |
| JP | 2005-57294 A1 | 3/2005 |
| JP | 2005-093920 A1 | 4/2005 |
| JP | 2005-101078 A1 | 4/2005 |
| JP | 2005-123249 A1 | 5/2005 |
| JP | 2005-167083 A1 | 6/2005 |
| JP | 2005-243690 A1 | 9/2005 |
| JP | 2006-203075 | 8/2006 |
| JP | 2006-216614 A1 | 8/2006 |
| JP | 2006-228974 A1 | 8/2006 |
| JP | 2006-229183 A1 | 8/2006 |
| JP | 2006-245312 | 9/2006 |
| JP | 2006-253501 A1 | 9/2006 |
| JP | 2006-269672 A1 | 10/2006 |
| JP | 2006-287178 A1 | 10/2006 |
| JP | 2006-335484 A1 | 12/2006 |
| JP | 2007-005659 A1 | 1/2007 |
| JP | 2007-288029 A1 | 1/2007 |
| JP | 2007-067178 A1 | 3/2007 |
| JP | 2007-150071 A1 | 6/2007 |
| JP | 2007-158260 A1 | 6/2007 |
| JP | 2007-208064 A1 | 8/2007 |
| JP | 2007-227984 | 9/2007 |
| JP | 2007-287887 A1 | 11/2007 |
| JP | 2009-99577 A1 | 5/2009 |
| JP | 2009-164256 A1 | 7/2009 |
| JP | 2009-076893 A1 | 9/2009 |
| KR | 1997-0011065 A1 | 3/1997 |
| KR | 1999-0023624 A | 3/1999 |
| KR | 2001-0029862 A | 4/2001 |
| KR | 2002-0035758 A1 | 5/2002 |
| KR | 10-0387418 B1 | 6/2003 |
| KR | 10-2003-0087418 A | 11/2003 |
| KR | 2003-0086900 A | 11/2003 |
| KR | 10-2004-0054517 A | 6/2004 |
| KR | 1020050049935 A1 | 5/2005 |
| KR | 10-2005-0051280 A | 6/2005 |
| KR | 10-2006-0033423 A | 4/2006 |
| KR | 10-2006-0088495 A | 4/2006 |
| KR | 2006-0050112 A | 5/2006 |
| KR | 10-2006-0058188 A | 7/2006 |
| KR | 10-2006-0092061 A | 8/2006 |
| KR | 10-2006-0097613 A | 9/2006 |
| KR | 10-0634122 B1 | 10/2006 |
| KR | 10-2007-0007262 A | 1/2007 |
| KR | 2007-0003328 A | 1/2007 |
| KR | 10-0698352 A | 3/2007 |
| KR | 10-2007-0062522 A | 6/2007 |
| TW | 200631680 | 9/2006 |

OTHER PUBLICATIONS

Non-Final Office Action for U.S. Appl. No. 13/401,617 mailed on Feb. 2, 2015, 11 pages.
Office Action for corresponding Taiwanese Patent Application No. 101118484 dated Feb. 26, 2015, 15 pages. (English Translation is not available).
Non-Final Office Action for U.S. Appl. No. 12/343,292 mailed on Jun. 3, 2015, 25 pages.
Notice of Allowance for U.S. Appl. No. 13/401,625 mailed on Jun. 16, 2015, 15 pages.
Notice of Allowance for U.S. Appl. No. 12/324,802 mailed on Jun. 26, 2015, 20 pages.
Notice of Allowance for U.S. Appl. No. 13/401,644 mailed on Jun. 29, 2015, 15 pages.
Trial for Patent Invalidation for corresponding Korean Patent Application No. 10-1432358, dated May 22, 2015, 60 pages.
Non-Final Office Action for U.S. Appl. No. 13/401,625 mailed on Dec. 9, 2014, 16 pages.
Advisory Action for U.S. Appl. No. 13/401,617 mailed on Nov. 7, 2014, 4 pages.
Final Office Action for U.S. Appl. No. 12/324,788 mailed on Nov. 6, 2014, 44 pages.
Final Office Action for U.S. Appl. No. 12/343,292 mailed on Nov. 5, 2014, 20 pages.
Final Office Action for U.S. Appl. No. 13/401,644 mailed on Dec. 1, 2014, 20 pages.
Non-Final Office Action for U.S. Appl. No. 12/324,788 mailed May 27, 2011, 41 pages.
Non-Final Office Action for U.S. Appl. No. 12/163,951 mailed Jul. 11, 2011, 18 pages.
Non-Final Office Action for U.S. Appl. No. 12/343,302 mailed Aug. 19, 2011, 26 pages.
Non-Final Office Action for U.S. Appl. No. 12/324,802 mailed Sep. 14, 2011, 13 pages.
Non-Final Office Action for U.S. Appl. No. 12/343,292 mailed Oct. 28, 2011, 12 pages.
Final Office Action for U.S. Appl. No. 12/324,788 mailed Dec. 7, 2011, 26 pages.
Final Office Action for U.S. Appl. No. 12/163,951 mailed Jan. 19, 2012, 22 pages.
Non-Final Office Action for U.S. Appl. No. 12/324,794 mailed Feb. 3, 2012, 8 pages.
Final Office Action for U.S. Appl. No. 12/343,302 mailed Apr. 12, 2012, 33 pages.
Final Office Action for U.S. Appl. No. 12/324,802 mailed Apr. 20, 2012, 14 pages.
Final Office Action for U.S. Appl. No. 12/343,292 mailed Jun. 1, 2012, 15 pages.
Advisory Action for U.S. Appl. No. 12/343,292 mailed Oct. 12, 2012, 3 pages.
Non-Final Office Action for U.S. Appl. No. 13/401,625 mailed Mar. 14, 2013, 8 pages.
Notice of Allowance for U.S. Appl. No. 12/324,794 mailed May 29, 2013, 7 pages.
Non-Final Office Action for U.S. Appl. No. 13/401,644 mailed Jun. 21, 2013, 16 pages.
Non-Final Office Action for U.S. Appl. No. 13/401,617 mailed Sep. 17, 2013, 8 pages.
Final Office Action for U.S. Appl. No. 13/401,625 mailed Sep. 19, 2013, 11 pages.
Notice of Allowance for U.S. Appl. No. 14/011,993 mailed Oct. 7, 2013, 11 pages.
Final Office Action for U.S. Appl. No. 13/401,644 mailed Nov. 22, 2013, 20 pages.
Restriction Requirement for U.S. Appl. No. 12/163,951 mailed Feb. 3, 2014, 7 pages.
Non-Final Office Action for U.S. Appl. No. 13/401,625 mailed on Mar. 28, 2014, 11 pages.
Supplemental Notice of Allowance for U.S. Appl. No. 14/011,993 mailed on Apr. 1, 2014, 2 pages.
Non-Final Office Action for U.S. Appl. No. 13/401,644 mailed on Apr. 4, 2014, 10 pages.

(56) References Cited

OTHER PUBLICATIONS

Non-Final Office Action for U.S. Appl. No. 12/324,788 mailed on Apr. 4, 2014, 30 pages.
Non-Final Office Action for U.S. Appl. No. 12/324,802 mailed on Apr. 7, 2014, 17 pages.
Non-Final Office Action for U.S. Appl. No. 12/343,302 mailed on Apr. 10, 2014, 22 pages.
Restriction Requirement for U.S. Appl. No. 12/343,292 mailed on Apr. 10, 2014, 6 pages.
Notice of Allowance for U.S. Appl. No. 12/163,951 mailed on Jul. 10, 2014, 9 pages.
Final Office Action for U.S. Appl. No. 13/401,617 mailed on Jun. 2, 2014, 10 pages.
Office Action for corresponding Chinese Application No. 20081010225036.7 dated Sep. 18, 2009, 4 pages.
Office Action for corresponding Korean Application No. 10-2008-0060084 dated Mar. 9, 2010, 5 pages.
Notice of Allowance of Korean Application No. 10-2008-0118967 dated Oct. 21, 2010, 2 pages total.
Office Action for corresponding Korean Application No. 10-2008-0132304 mailed Oct. 25, 2010, 4 pages.
Office Action for corresponding Korean Application No. 10-2008-0132009 dated Jan. 18, 2011, 5 pages.
Invalidation Trial for corresponding Korean Patent No. 10-1001511 received on Apr. 13, 2011, 53 pages.
Notice of Allowance for corresponding Korean application No. 10-2010-0105888 dated Apr. 22, 2011, 3 pages.
Invalidation Trial for corresponding Korean Application No. 10-1010086 dated Apr. 25, 2011, 68 pages.
Office Action for corresponding Korean Application No. 10-2008-0132009 dated Jul. 21, 2011, 5 pages.
Office Action for corresponding Japanese Application No. 2007-172496 dated Sep. 27, 2011, 4 pages.
Invalidation Trial for corresponding Korean Patent No. 10-1036420 received on Sep. 27, 2011, 36 pages.
Office Action for corresponding Japanese Application No. 2007-340427 dated Oct. 4, 2011, 2 pages.
Office Action for corresponding Japanese Application No. 2007-340428 dated Oct. 4, 2011, 2 pages.
Invalidation Trial for corresponding Korean Patent No. 10-1047799 (Korean Patent application No. 10-2008-132304) received on Nov. 16, 2011, 69 pages.
Office Action for corresponding Japanese Application No. 2008-076610 dated Jan. 10, 2012, 2 pages.
Office Action for corresponding Japanese Application No. 2008-076611 dated Jan. 10, 2012, 2 pages.
Office Action for corresponding Japanese Application No. 2008-076608 dated Jan. 17, 2012, 4 pages.
Office Action for corresponding Taiwanese Application No. 097150911 dated Apr. 10, 2012, 6 pages.
Office Action for corresponding Japanese Application No. 2007-340428 dated Apr. 24, 2012, 3 pages.
Office Action for corresponding Japanese Application No. 2007-310676 dated May 8, 2012, 3 pages.
Office Action for corresponding Japanese Application No. 2007-310677 dated May 8, 2012, 4 pages.
Office Action for corresponding Taiwanese Application No. 097150912 dated Jun. 1, 2012, 6 pages.
Notice of Allowance for corresponding Korean Patent Application No. 10-2008-0132009 dated Jun. 22, 2012, 3 pages.
Office Action for corresponding Japanese Application No. 2007-310675 dated Jul. 31, 2012, 3 pages.
Decision of Patent for corresponding Japanese Patent Application No. 2007-310677 dated Oct. 16, 2012, 3 pages.
Office Action for corresponding Korean Patent Application No. 10-2012-0005204 dated Nov. 1, 2012, 6 pages.
Office Action for corresponding Japanese Patent Application No. 2008-327897 dated Nov. 6, 2012, 4 pages.
Office Action for corresponding Japanese Patent Application No. 2007-340430 dated Dec. 18, 2012, 3 pages.
Information Statement for corresponding Japanese Patent Application No. 2007-310676 dated Jan. 15, 2013, 4 pages.
Office Action for corresponding Japanese Patent Application No. 2011-265835 dated Apr. 23, 2013, 3 pages.
Trial Decision for corresponding Korean Patent No. 10-1047799 dated Jun. 25, 2013, 125 pages.
Office Action for corresponding Japanese Patent Application No. 2012-118585 dated Jun. 25, 2013, 3 pages.
Office Action for corresponding Japanese Patent Application No. 2011-257538 dated Jul. 2, 2013, 3 pages.
Invalidation Trial for corresponding Korean Patent No. 10-1213284 dated Jul. 3, 2013, 31 pages.
Invalidation trial for corresponding Taiwanese U.S. Pat. No. 97124376 dated Jul. 30, 2013, 43 pages.
Invalidation Trial for corresponding Korean Patent No. 10-1170211 dated Aug. 7, 2013, 26 pages.
Office Action for corresponding Japanese Patent Application No. 2012-118584 dated Oct. 22, 2013, 2 pages.
Invalidation Trial for corresponding Korean Patent No. 10-1276946 dated Nov. 12, 2013, 52 pages.
Office Action for corresponding Japanese Patent Application No. 2011-257538 dated Dec. 3, 2013, 3 pages.
Argument in the Trial for Patent Invalidation for corresponding Korean Patent No. 10-1213284 dated Dec. 20, 2013, 19 pages.
Notice of Allowance for corresponding Korean Patent Application No. 10-2012-0005204 dated Jan. 22, 2014, 3 pages.
Argument in the Trial for Patent Invalidation for corresponding Korean Patent No. 10-1170211 dated Feb. 27, 2014, 21 pages. (English translation is not available).
Information Statement for corresponding Japanese Patent Application No. 2012-118583 dated May 16, 2014, 22 pages. (translation is not available).
Machine Translation of KR 10-2006-0033423 A published Apr. 19, 2006, 14 pages.
Office Action for corresponding Japanese Patent Application No. 2012-118583 dated Jun. 24, 2014, 2 pages. (translation is not available).
Argument in the Trial for Patent Invalidation for corresponding Korean Patent No. 10-1276946 dated May 28, 2014, 45 pages. (English translation is not available).
Final Office Action for U.S. Appl. No. 12/324,802 mailed on Oct. 22, 2014, 24 pages.

* cited by examiner

| substrate identification information | order OA |
|---|---|
| Wa | 1 |
| Wb | 2 |
| Wc | 3 |
| Wd | 4 |
| We | 5 |
| Wf | 6 |
| Wg | 7 |
| Wh | 8 |

Fig.14

| order OA | substrate treatment line |
|---|---|
| 1 | Lu |
| 2 | Ld |
| 3 | Lu |
| 4 | Ld |
| 5 | Lu |
| 6 | Ld |
| 7 | Lu |
| 8 | Ld |

Fig.15

| order OB | order OA |
|---|---|
| 1 | 1 |
| 2 | 3 |
| 3 | 5 |
| 4 | 7 |

Fig.16A

| order OC | order OA |
|---|---|
| 1 | 2 |
| 2 | 4 |
| 3 | 6 |
| 4 | 8 |

Fig.16B

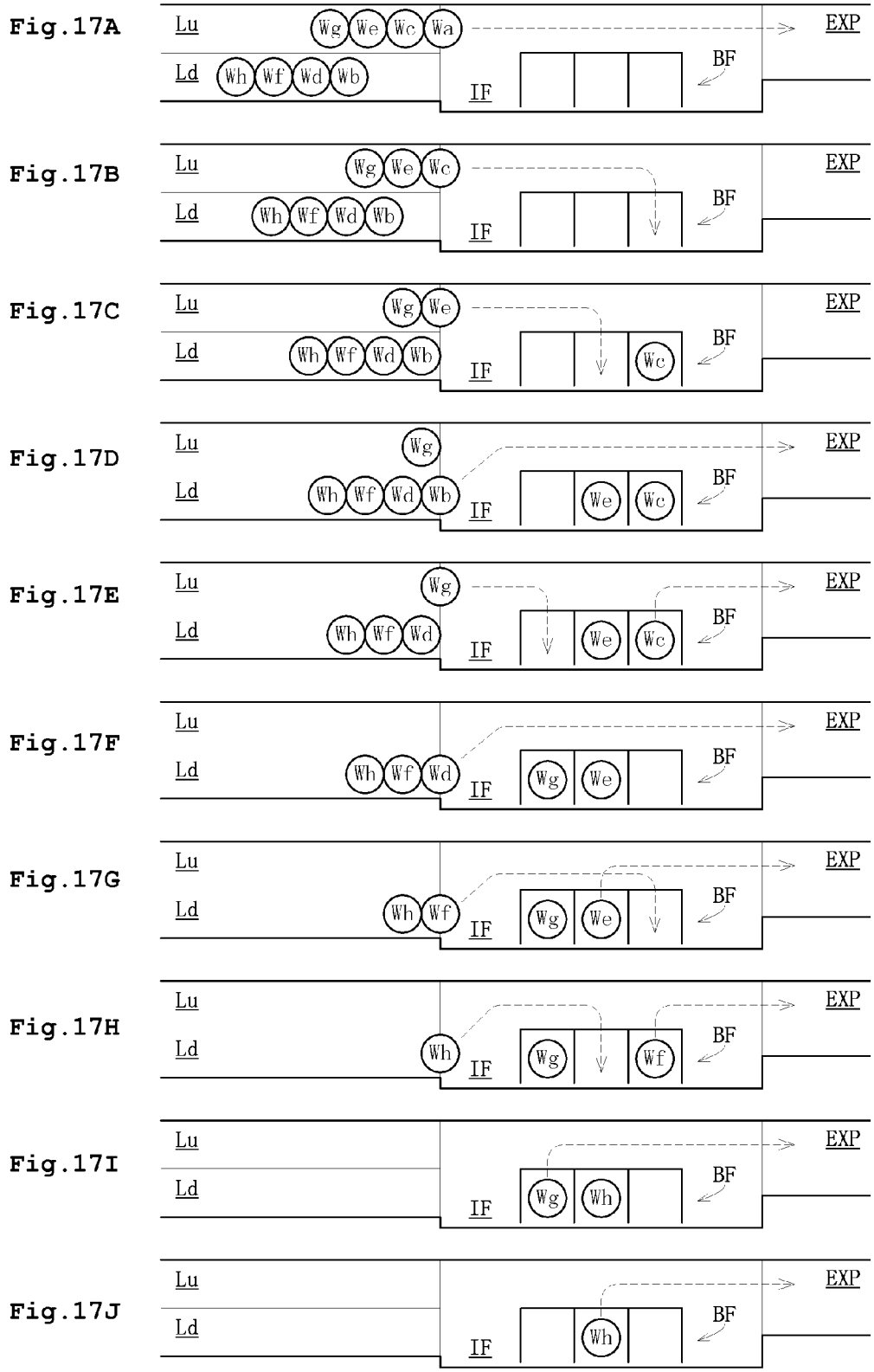

SUBSTRATE TREATING APPARATUS WITH SUBSTRATE REORDERING

CROSS-REFERENCES TO RELATED APPLICATIONS

This application is a continuation of U.S. patent application Ser. No. 12/343,302, filed Dec. 23, 2008, now abandoned, which claims priority to Japanese Patent Application 2007-340427, filed Dec. 28, 2007, the disclosures of which are incorporated herein by reference in their entirety.

BACKGROUND OF THE INVENTION

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

Conventionally, this type of substrate treating apparatus is used to form a resist film on substrates and develop the substrates exposed in a separate exposing machine. The apparatus includes a treating section having, arranged therein, a treating block for forming film such as resist film, a treating block for developing the substrates, and so on. Each treating block includes a single main transport mechanism and various treating units. The main transport mechanism of each block, while transporting substrates to the treating units in that block, transfers the substrates to and from the main transport mechanism of another, adjacent treating block. An interface section is provided for the treating block located at one end. The exposing machine separate from this apparatus is disposed adjacent to the interface section. The interface section transports substrates between the treating section and the exposing machine.

In the conventional apparatus having the above construction, the treating section carries out a series of treatments for forming resist film and the like on the substrates, and then feeds the substrates to the interface section. The interface section transports the substrates to the exposing machine. The treating section treats the substrates in an order in which the substrates are loaded into the treating section. Thus, the order of the substrates fed from the treating section to the interface section is the same as the order of the substrates loaded into the treating section. The interface section transfers the substrates received from the treating section directly to the exposing machine. Consequently, the substrates are transported to the exposing machine in the order of loading into the treating section. The exposing machine exposes the substrates transported thereto and feeds them back to the interface section. The interface section transports the substrates received from the exposing machine to the treating section, which then develops these substrates.

Although the series of treatments includes also the treatment in the exposing machine separate from this apparatus, the substrates are transported in the same order to each treating block and the exposing machine. It is therefore easy to manage and control each substrate, and to conduct a follow-up check on the treatment history of each substrate, for example (as disclosed in Japanese Unexamined Patent Publication No. 2003-324139, for example).

The conventional apparatus with such a construction has the following drawbacks.

In the conventional apparatus, each treating block has only a single main transport mechanism, making it difficult to improve the throughput of the entire apparatus significantly. On the other hand, it is conceivable to increase the number of main transport mechanisms in each treating block and to provide a plurality of substrate transport paths in the treating section to enable parallel treatment of substrates. With such a treating section, however, the different transport paths could produce an inequality in time taken from introduction into the treating section to feeding to the interface section. The order of substrates transported from the interface section to the exposing machine may not be the same as the order of loading into the treating section. This will result in an inconvenience that the control of each substrate and a follow-up check on the treatment history of each substrate cannot be conducted reliably.

SUMMARY OF THE INVENTION

This invention has been made having regard to the state of the art noted above. Its object is to provide a substrate treating apparatus that can effectively control the order of substrates transported from a treating section to a separate exposing machine even where the treating section has a plurality of substrate transport paths.

The above object is fulfilled, according to this invention, by a substrate treating apparatus comprising a treating section including a plurality of substrate treatment lines for treating substrates while transporting the substrates substantially horizontally, the substrate treatment lines being capable of treating the substrates in parallel; and an interface section disposed adjacent the treating section for transporting the substrates fed from the substrate treatment lines to an exposing machine provided separately from the apparatus; wherein the substrates are transported to the exposing machine in the order in which the substrates are loaded into the treating section.

According to this invention, the treating section has a plurality of substrate treatment lines to improve the throughput of the substrate treating apparatus significantly. The substrates can receive treatment in the substrate treatment lines in parallel, and can be transported to the exposing machine in the order in which the substrates are loaded into the treating section. Since the order of the substrates transported to the exposing machine is the same as the order in which the substrates are loaded into the treating section, each substrate can be controlled easily. A follow-up check can also be performed easily on the history of treatment of each substrate in the treating section or in the exposing machine.

In the invention noted above, the substrate treatment lines may be arranged one over another. The substrate treatment lines arranged one over another can prevent an enlarged footprint of the apparatus.

In the invention noted above, the interface section may be arranged to adjust the order of the substrates fed from the substrate treatment lines to the order in which the substrates are loaded into the treating section. With the interface section arranged to adjust the order of the substrates fed from the substrate treatment lines, there is no need to adjust timing of substrate feeding between the substrate treatment lines. This allows each of the substrate treatment lines to proceed with treatment of the substrates independently.

In the invention noted above, the interface section may include an interface transport mechanism for transporting the substrates to and from each of the substrate treatment lines and the exposing machine and a buffer unit for temporarily storing the substrates. The interface transport mechanism is arranged to receive a substrate from the substrate treatment lines, to transport the substrate received to the exposing machine when the substrate is the next substrate to be transported to the exposing machine, and to place the substrate received in the buffer unit when the substrate is different from the next substrate to be transported to the exposing machine. When one of the substrate treatment lines feeds a substrate, the interface section will receive the substrate. This enables the substrate treatment line to feed a new substrate. Thus, the substrate treatment line can feed the substrates promptly after the treatment, thereby preventing a lowering of the throughput of the substrate treating apparatus. The interface section has the buffer unit and when a substrate fed from one of the substrate treatment lines is not the next one to be transported to the exposing machine the substrate is temporarily put on standby in the buffer unit. Thus, the order of the substrates fed from the treating section can be adjusted conveniently in the interface section.

The "next substrate to be transported to the exposing machine" means the substrate to be transported to the exposing machine after the substrate that has already been transported to the exposing machine when the interface transport mechanism interface receives a substrate fed from one of the substrate treatment lines.

In the invention noted above, the interface transport mechanism may be arranged to transport a substrate from the buffer unit to the exposing machine when a substrate placed in the buffer unit becomes the next substrate to be transported to the exposing machine. When a substrate placed in the buffer unit becomes the next substrate to be transported to the exposing machine, the interface transport mechanism transports the substrate to the exposing machine. Thus, even where the order of substrates fed from the treating section is different from the order of substrates loaded into the treating section, the order of substrates transported to the exposing machine can be brought into agreement with the order of substrates loaded into the treating section.

In the invention noted above, the interface transport mechanism may be arranged to prioritize receiving a substrate being fed from one of the substrate treatment lines above transporting the next substrate currently in the buffer unit to the exposing machine. Then, the substrate treatment lines can always be fed the substrates promptly after the treatment.

In the invention noted above, the interface transport mechanism may include a first transport mechanism for transporting the substrates to and from each of the substrate treatment lines and to the buffer unit; and a second transport mechanism for transferring the substrates to and from the first transport mechanism and transporting the substrates to and from the exposing machine. The first transport mechanism is arranged to transfer a substrate received from one of the substrate treatment lines to the second transport mechanism when the substrate is the next substrate to be transported to the exposing machine, to place the received substrate in the buffer unit when the substrate is different from a next substrate to be transported to the exposing machine, and to transfer the next substrate from the buffer unit to the second transport mechanism when a substrate placed in the buffer unit becomes the next substrate to be transported to the exposing machine. The second transport mechanism is arranged to transport a substrate received from the first transport mechanism to the exposing machine. The interface transport mechanism includes a first transport mechanism for receiving the substrates fed from the substrate treatment lines and a separate second transport mechanism for transporting the substrates to the exposing machine. Thus, the interface section can transport the substrates efficiently between the treating section and the exposing machine.

In the invention noted above, the interface transport mechanism may include a first transport mechanism for transporting the substrates to and from each of the substrate treatment lines and to the buffer unit; and a second transport mechanism for transferring the substrates to and from the first transport mechanism and transporting the substrates to and from the buffer unit and the exposing machine. The first transport mechanism is arranged to transfer a substrate received from one of the substrate treatment lines to the second transport mechanism when the substrate is the next substrate to be transported to the exposing machine, and to place the substrate received in the buffer unit when the substrate is different from the next substrate to be transported to the exposing machine. The second transport mechanism is arranged to transport any substrate received from the first transport mechanism to the exposing machine, and to transport the next substrate from the buffer unit to the exposing machine when a substrate placed in the buffer unit becomes the next substrate to be transported to the exposing machine. The interface transport mechanism includes a first transport mechanism for receiving the substrates fed from the substrate treatment lines, and a separate second transport mechanism for transporting the substrates to the exposing machine. Thus, the interface section can transport the substrates efficiently between the treating section and the exposing machine. A higher efficiency is realized with the second transport mechanism capable of transporting substrates directly from the buffer unit to the exposing machine.

In the invention noted above, the interface transport mechanism may be arranged to change positions of substrates placed in the buffer unit according to the substrate treatment lines from which the substrates are fed. Considering each substrate treatment line, the order of substrates fed from each substrate treatment line is the same as the order of substrates loaded into this substrate treatment line. Thus, by changing positions of substrates placed in the buffer unit according to the substrate treatment lines, the order of substrates to be transported to the exposing machine can be adjusted conveniently in the interface section.

In the invention noted above, the order in which the substrates are loaded into the treating section may be determined based on a relationship of substrate identifying information with the order in which the substrates are loaded into the treating section. Then, the order of loading into the treating section can be determined with respect to the substrates fed from each substrate treatment line. This facilitates an adjustment of the order of substrates to be transported to the exposing machine.

In the invention noted above, the order in which the substrates are loaded into the treating section may be determined based on a relationship of the substrate treatment lines transporting the substrates with the order in which the substrates are loaded into the treating section. Considering each substrate treatment line, the order of substrates fed from each substrate treatment line is the same as the order of substrates loaded into this substrate treatment line. Thus, based on the relationship of information showing to which substrate treatment line the substrates have been distributed with the order in which the substrates are loaded into the treating section, the order in which the substrates are loaded into the treating section can be presumed with respect to the substrates fed from each substrate treatment line. Thus, the order of substrates to be transported to the exposing machine can be adjusted easily.

In another aspect of the invention, a substrate treating apparatus comprises a treating section including a plurality of treating blocks arranged in juxtaposition, each having treating units arranged on each of vertical stories for treating substrates, and a main transport mechanism provided on each story for transporting the substrates to and from the treating units on the each story, the main transport mechanisms on the same story of adjacent treating blocks being constructed to transfer the substrates to and from each other, the treating blocks arranged at opposite ends acting as a first treating block and a second treating block, respectively, the substrates receiving a series of treatments on each story while the substrates loaded into each story of the first treating block are transported to the second treating block through the same story of each treating block; an indexer section disposed adjacent to the first treating block for transporting the substrates to each story of the first treating block; an interface section disposed adjacent to the second treating block and having an interface transport mechanism for transporting the substrates to and from each story of the second treating block and an exposing machine provided separately from the apparatus; and a controller for controlling the interface transport mechanism to transport the substrates fed from the second treating block to the exposing machine in an order in which the substrates are loaded into the first treating block.

According to this invention, the indexer section loads the substrates into the treating section. The substrates loaded from the indexer section are transported to either story of the first treating block located at one end of the treating section, respectively. Each story of the first treating block transports the substrates received to the same story of an adjoining treating block. In this way, the substrates loaded into each story of the first treating block are transported through the same story of each treating block to the second treating block located at the other end of the treating section. At this time, the substrates are treated in the treating units arranged on each story of each treating block. The second treating block feeds the substrates transported from the first treating block to the interface section. The interface transport mechanism provided in the interface section receives the substrates fed from each story of the second treating block and transports the substrates to the exposing machine. The controller controls the interface transport mechanism to transport the substrates fed from the second treating block to the exposing machine in the order in which the substrates are loaded into the first treating block. The plurality of stories of each treating block are arranged one over another, which significantly improves the throughput of the substrate treating apparatus without increasing its footprint. While treating the substrates in parallel in different stories from the first treating block to the second treating block, the substrates are transported to the exposing machine in the order in which the substrates are loaded into the treating section. Thus, each substrate can be controlled easily. A follow-up check can also be performed easily on the history of treatment of each substrate in the treating section or in the exposing machine.

In the invention noted above, under control of the controller, the interface transport mechanism may be arranged to adjust the substrates fed from the second treating block to the order in which the substrates are loaded into the first treating block. With the interface transport mechanism arranged to adjust the order of the substrates fed from the second treating block, there is no need to adjust timing of substrate feeding between the different stories from the first treating block to the second treating block. This allows each of the different stories from the first treating block to the second treating block to proceed with treatment of the substrates independently.

In the invention noted above, the interface section may include a buffer unit for temporarily storing the substrates, wherein under control of the controller the interface transport mechanism is arranged to transport the substrate received from the second treating block to the exposing machine when the substrate is the next substrate to be transported to the exposing machine, and to place the substrate received in the buffer unit when the substrate is different from the next substrate to be transported to the exposing machine. When each story of the second treating block feeds a substrate, the interface transport mechanism will receive the substrate. This enables each story of the second treating block to be fed a new substrate. Thus, the second treating block can feed the substrates smoothly, thereby preventing a lowering of the throughput of the substrate treating apparatus. The interface section has the buffer unit. A substrate other than the next one to be transported to the exposing machine is temporarily put on standby in the buffer unit. Thus, the interface section can conveniently adjust the order of the substrates fed from the second treating block.

In the invention noted above, under control of the controller, the interface transport mechanism may be arranged to transport the next substrate from the buffer unit to the exposing machine when a substrate placed in the buffer unit becomes the next substrate to be transported to the exposing machine. When a substrate placed in the buffer unit becomes the next substrate to be transported to the exposing machine, the interface transport mechanism transports the substrate to the exposing machine. Thus, even where the order of substrates fed from the second treating block is different from the order of substrates loaded into the first treating block, the order of substrates transported to the exposing machine can be brought into agreement with the order of substrates loaded into the first treating block.

In the invention noted above, under control of the controller the interface transport mechanism may be arranged to prioritize receiving the substrate fed from the second treating block over transporting a substrate placed in the buffer unit even when a substrate placed in the buffer unit becomes the next substrate to be transported to the exposing machine. Then, each story of the second treating block can always be fed the substrates smoothly.

In the invention noted above, the interface transport mechanism may include a first transport mechanism for transporting the substrates to and from each story of the second treating block and to the buffer unit and a second transport mechanism for transferring the substrates to and from the first transport mechanism and transporting the substrates to and from the exposing machine. The first transport mechanism, under control of the controller, is arranged to transfer a substrate received from each story of the second treating block to the second transport mechanism when the substrate is the next substrate to be transported to the exposing machine, to place the substrate received in the buffer unit when the substrate is different from the next substrate to be transported to the exposing machine, and to transfer the next substrate from the buffer unit to the second transport mechanism when a substrate placed in the buffer unit becomes the next substrate to be transported to the exposing machine. The second transport mechanism, under control of the controller, is arranged to transport a substrate received from the first transport mechanism to the exposing machine. The interface transport mechanism includes a first transport mechanism for receiving the substrates fed from each story of the second treating block and a separate second transport mechanism for transporting the substrates to the exposing machine. Thus, the interface section can transport the substrates efficiently between the treating section and the exposing machine.

In the invention noted above, the interface transport mechanism may include a first transport mechanism for transporting the substrates to and from each story of the second treating block and the buffer unit and a second transport mechanism for transferring the substrates to and from the first transport mechanism and transporting the substrates to and from the buffer unit and the exposing machine. The first transport mechanism, under control of the controller, is arranged to transfer a substrate received from each story of the second treating block to the second transport mechanism when the substrate is the next substrate to be transported to the exposing machine, and to place the substrate received in the buffer unit when the substrate is different from the next substrate to be transported to the exposing machine. The second transport mechanism is arranged to transport any substrate received from the first transport mechanism to the exposing machine and to transport the next substrate from the buffer unit to the exposing machine when a substrate placed in the buffer unit becomes the next substrate to be transported to the exposing machine. The interface transport mechanism includes a first transport mechanism for receiving the substrates fed from each story of the second treating block and a separate, second transport mechanism for transporting the substrates to the exposing machine. Thus, the interface section can transport the substrates efficiently between the treating section and the exposing machine. A higher efficiency is realized with the second transport mechanism capable of transporting substrates directly from the buffer unit to the exposing machine.

In the invention noted above, the controller may be arranged to stop loading the substrates from the indexer section into the treating section when the substrates placed in the buffer unit exceeds a predetermined number. When the buffer unit is unable to receive any further substrates, it is impossible to feed substrates smoothly from the treating section to the interface section. If substrates were loaded into the treating section under such circumstances, variations would occur with the substrates in the time taken from loading into the treating section to feeding from the treating section resulting, for example, in deterioration in the quality of treatment of the substrates. However, according to this invention, loading of the substrates from the indexer section into the treating section is stopped when the substrates placed in the buffer unit exceed a predetermined number. Thus, the deterioration in the quality of treatment of the substrates can be precluded.

In the invention noted above, the controller may be arranged to adjust an order of the substrates to be transported to the exposing machine based on a relationship of substrate identifying information with the order in which the substrates are loaded from the indexer section into the treating section. Then, the order of loading into the treating section can be determined with respect to the substrates fed from each story of the second treating block. This facilitates an adjustment of the order of substrates to be transported to the exposing machine.

In the invention noted above, the controller may be arranged to adjust an order of the substrates to be transported to the exposing machine based on a relationship of the stories of the first treating block transporting the substrates with the order in which the substrates are loaded from the indexer section into the treating section. Considering each of the same stories from the first treating block to the second treating block, the order of substrates fed from each substrate treatment line is the same as the order of substrates loaded into this substrate treatment line. Thus, the order in which the substrates are loaded into the treating section can be presumed based on the relationship of information showing to which story of the first treating block the substrates have been distributed, with the order in which the substrates are loaded into the treating section. This facilitates adjustment of the order of substrates. Therefore, the order of substrates to be transported to the exposing machine can be adjusted easily.

In the invention noted above, the indexer section may be arranged to distribute the substrate loaded into the treating section regularly and alternately to the stories of the first treating block. Then, the order of the substrates loaded into the first treating block is clear, which enables the order of substrates to be transported to the exposing machine to be adjusted conveniently.

In the invention noted above, the treating section may include coating blocks and developing blocks as the treating blocks. Each of the coating blocks has resist film coating units as the treating units for applying a resist film material to the substrates and each of the developing blocks has developing units as the treating units for supplying a developer to the substrates. Then, resist film can be formed on the substrates and the substrates can be developed effectively.

This specification discloses an invention directed to the following substrate treating apparatus also:

(1) The apparatus according to an embodiment wherein the interface section is arranged to receive the substrates in an order of feeding from the substrate treatment lines.

According to the apparatus defined in (1) above, each substrate treatment line can feed following substrates promptly.

(2) The apparatus according to an embodiment wherein each of the substrate treatment lines is arranged to carry out treatment for forming resist film on the substrates.

(3) The apparatus according to an embodiment wherein each of the substrate treatment lines is arranged to carry out treatment for developing the substrates.

(4) The apparatus according to an embodiment wherein each of the substrate treatment lines includes a plurality of main transport mechanisms arranged horizontally, a plurality of treating units provided for each of the main transport mechanisms for treating the substrates, wherein each of the main transport mechanisms is arranged to transfer the substrates to and from a different one of the main transport mechanisms horizontally adjacent thereto while transporting the substrates to and from the treating units associated therewith, thereby carrying out a series of treatments on the substrates.

According to the apparatus defined in (4) above each substrate treatment line can treat the substrates effectively.

(5) The apparatus according to (4) above wherein the treating units provided for each of the substrate treatment lines include resist film coating units for applying a resist film material to the substrates.

(6) The apparatus according to (4) above wherein the treating units provided for each of the substrate treatment lines include developing units for supplying a developer to the substrates.

(7) The apparatus according to an embodiment, wherein the first transport mechanism and the second transport mechanism are arranged to transfer the substrates through a receiver.

According to the apparatus defined in (7) above, the substrates can be transferred efficiently between the first transport mechanism and the second transport mechanism.

(8) The apparatus according to an embodiment wherein the buffer unit is capable of receiving a plurality of substrates.

According to the apparatus defined in (8) above, the order of substrates can be adjusted conveniently.

(9) The apparatus according to an embodiment wherein the interface section is arranged to receive the substrates in an order of feeding from each story of the second treating block.

According to the apparatus defined in (9) above, each story of the second treating block can feed following substrates promptly.

BRIEF DESCRIPTION OF THE DRAWINGS

For the purpose of illustrating the invention, there are shown in the drawings several embodiments, it being understood, however, that the invention is not limited to the precise arrangement and instrumentalities shown.

FIG. 14 is a schematic view showing information on a relationship between identification information on substrates and an order of substrates loaded from an ID section into a treating section;

FIG. 15 is a schematic view showing information on a relationship between an order of substrates loaded from the ID section into the treating section and substrate treatment lines to which the substrates are transported;

FIG. 16A is a schematic view showing information on a relationship between an order of substrates fed from a substrate treatment line to an IF section and an order of substrates loaded from the ID section into the treating section;

FIG. 16B is a schematic view showing information on a relationship between an order of substrates fed from a substrate treatment line to the IF section and an order of substrates transported from the ID section to the treating section;

FIG. 17A is a view schematically showing how, with progress of time, a plurality of substrates fed from each substrate treatment line are transported through the IF section to the exposing machine;

FIG. 17B is a view schematically showing how, with progress of time, the plurality of substrates fed from each substrate treatment line are transported through the IF section to the exposing machine;

FIG. 17C is a view schematically showing how, with progress of time, the plurality of substrates fed from each substrate treatment line are transported through the IF section to the exposing machine;

FIG. 17D is a view schematically showing how, with progress of time, the plurality of substrates fed from each substrate treatment line are transported through the IF section to the exposing machine;

FIG. 17E is a view schematically showing how, with progress of time, the plurality of substrates fed from each substrate treatment line are transported through the IF section to the exposing machine;

FIG. 17F is a view schematically showing how, with progress of time, the plurality of substrates fed from each substrate treatment line are transported through the IF section to the exposing machine;

FIG. 17G is a view schematically showing how, with progress of time, the plurality of substrates fed from each substrate treatment line are transported through the IF section to the exposing machine;

FIG. 17H is a view schematically showing how, with progress of time, the plurality of substrates fed from each substrate treatment line are transported through the IF section to the exposing machine;

FIG. 17I is a view schematically showing how, with progress of time, the plurality of substrates fed from each substrate treatment line are transported through the IF section to the exposing machine;

FIG. 17J is a view schematically showing how, with progress of time, the plurality of substrates fed from each substrate treatment line are transported through the IF section to the exposing machine.

DETAILED DESCRIPTION OF THE INVENTION

One embodiment of this invention will be described in detail hereinafter with reference to the drawings.

Figure 1:
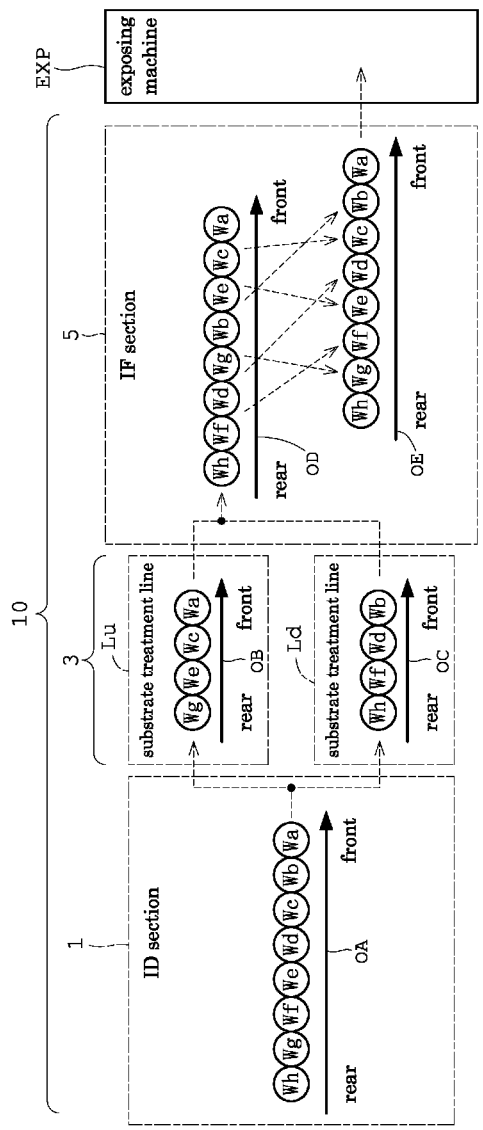
FIG. 1 is a schematic view showing an outline of a substrate treating apparatus according to this invention.

An outline of this embodiment will be described first. FIG. 1 is a plan view showing an outline of a substrate treating apparatus according to this embodiment.

This embodiment provides a substrate treating apparatus 10 for forming resist film or the like on substrates (e.g. semi-conductor wafers) W, and developing exposed wafers W. The substrate treating apparatus 10 will be referred to simply as the apparatus 10 as appropriate. This apparatus 10 includes an indexer section (hereinafter called "ID section") 1, a treating section 3 and an interface section (hereinafter called "IF section") 5. The ID section 1, treating section 3 and IF section 5 are arranged adjacent one another in the stated order. An exposing machine EXP, which is an external apparatus separate from this apparatus 10, is disposed adjacent the IF section 5.

The ID section 1 transfers wafers W to the treating section 3. The treating section 3 includes a plurality of (e.g. two) substrate treatment lines Lu and Ld. Each substrate treatment line Lu or Ld treats the wafers W while transporting the wafers W substantially horizontally. The substrate treatment lines Lu and Ld are arranged one over the other. Each substrate treatment line Lu or Lu has one end thereof opposed to the ID section 1, and the other end opposed to the IF section 5. Each substrate treatment line Lu or Ld has main transport mechanisms and treating units as described hereinafter. In the following description, the substrate treatment lines Lu and Ld will be referred to simply as the "substrate treatment lines L" when they are not distinguished. The IF section 5 transfers the wafers W between the treating section 3 and exposing machine EXP. The exposing machine EXP exposes the wafers W.

The apparatus 10 constructed in this way operates as follows. The ID section 1 transports a plurality of wafers W into the treating section 3. Here, as shown in FIG. 1, a case of transporting eight wafers Wa, Wb, Wc, . . . , and Wh from the ID section 1 to the treating section 3 will be described by way of example. The arrow affixed with sign OA in FIG. 1 indicates an order in which the wafers W are transported from the ID section 1 to the treating section 3; it signifies that wafer Wa is the first, wafer Wb is the second, wafers Wc and Wd are the third and fourth, respectively, . . . and wafer Wh is the eighth. The other arrows indicates the following orders: order OB of wafers W fed from the substrate treatment line Lu to the IF section 5; order OC of wafers W fed from the substrate treatment line Ld to the IF section 5, order OD of wafers W fed from the substrate treatment lines Lu Ld as a whole, i.e. from the treating section 3 to the IF section 5, and order OE of wafers W transported from the IF section 5 to the exposing machine EXP. These orders will be referred to hereinafter simply as "order OA", "order OB" and so on as appropriate.

In transporting the wafers W from the ID section 1 to the treating section 3, the wafers W are distributed alternately to the substrate treatment lines Lu and Ld. As a result, wafers Wa, Wc, We and Wg, which are the first, third, fifth and seventh in the order OA, are transported to the substrate treatment line Lu, and wafers Wb, Wd, Wf and Wh, which are the second, fourth, sixth and eighth in the order OA, are transported to the substrate treatment line Ld.

Each of the substrate treatment lines Lu and Ld carries out a series of treatments for the wafers W transported thereto, and feeds the wafers W to the IF section 5. As far as the substrate treatment line Lu is concerned, the order OB is the same as the order of wafers W transported from the ID section 1 to the substrate treatment line Lu. As far as the substrate treatment line Ld is concerned, the order OC is the same as the order of wafers W transported from the ID section 1 to the substrate treatment line Ld. However, the time taken from loading-in to feeding-out is not necessarily the same between the substrate treatment lines Lu and Ld even if the same treatment is carried out. Therefore, when the substrate treatment lines Lu and Ld are seen as a whole, the order OD of wafers W fed therefrom is not necessarily the same as the order OA. FIG. 1 illustrates the case where the order OD of wafers W fed out of the treating section 3 differs from the order OA of wafers W loaded into the treating section 3.

The IF section 5 successively receives wafers W fed from the respective substrate treatment lines Lu and Ld. Therefore, the IF section 5 receives wafers W from the treating section 3 is the same order as order OD.

The IF section 5 adjusts the wafers W fed from the treating section 3 to the order OA of loading into the treating section 3. Then, the IF section 5 transports the wafers W to the exposing machine EXP in the same order as the order OA of wafers W loaded into the treating section 3. That is, the order OE in which the IF section 5 transports the wafers W to the exposing machine EXP is the same as the order OA.

The exposing machine EXP exposes the wafers W transported thereto. Although not shown in FIG. 1, the exposing machine EXP transports the exposed wafers W back to the IF section 5. The IF section 5 receives the wafers W from the exposing machine EXP, and transports the wafers W to the treating section 3. The treating section 3 transports the wafers W to the ID section 1 through each substrate treatment line L.

Thus, even where wafers W are treated in parallel in a plurality of (two) substrate treatment lines Lu and Ld, the order OE of wafers W transported to the exposing machine EXP is the same as the order OA of wafers W loaded into the treating section 3. Therefore, each of the wafers W can be controlled easily. A follow-up check may also be carried out easily on the history of treatment of each wafer W in the treating section 3 and exposing machine EXP.

This apparatus 10, including the plurality of (two) substrate treatment lines Lu and Ld treats wafers W in parallel in the substrate treatment lines L, thereby significantly improves throughput. The substrate treatment lines Lu and Ld are arranged one over the other, and this arrangement can prevent an enlarged footprint of the apparatus 10.

Figure 2:
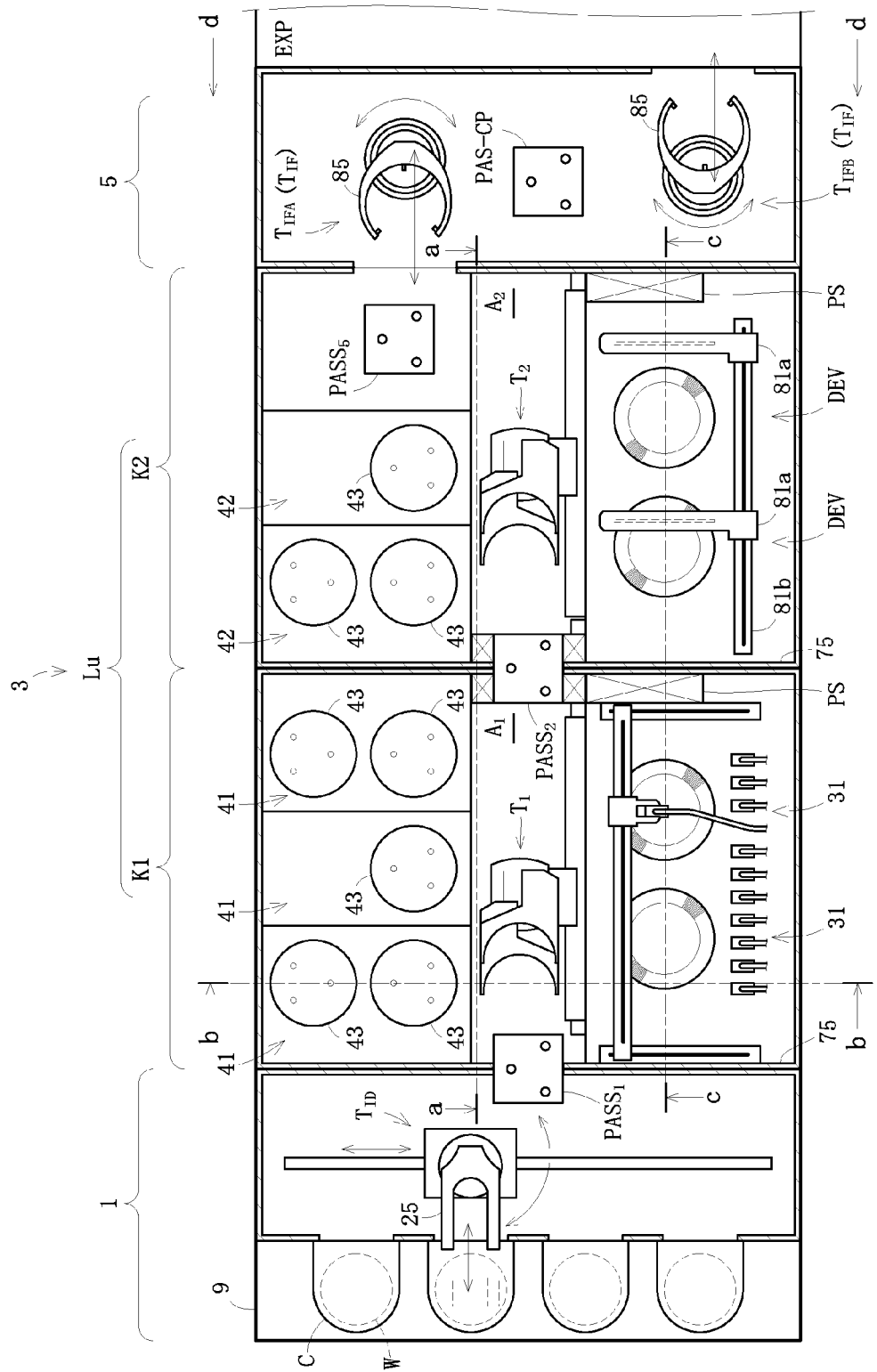
FIG. 2 is a plan view showing an outline of the substrate treating apparatus according to this invention.
Figure 3:
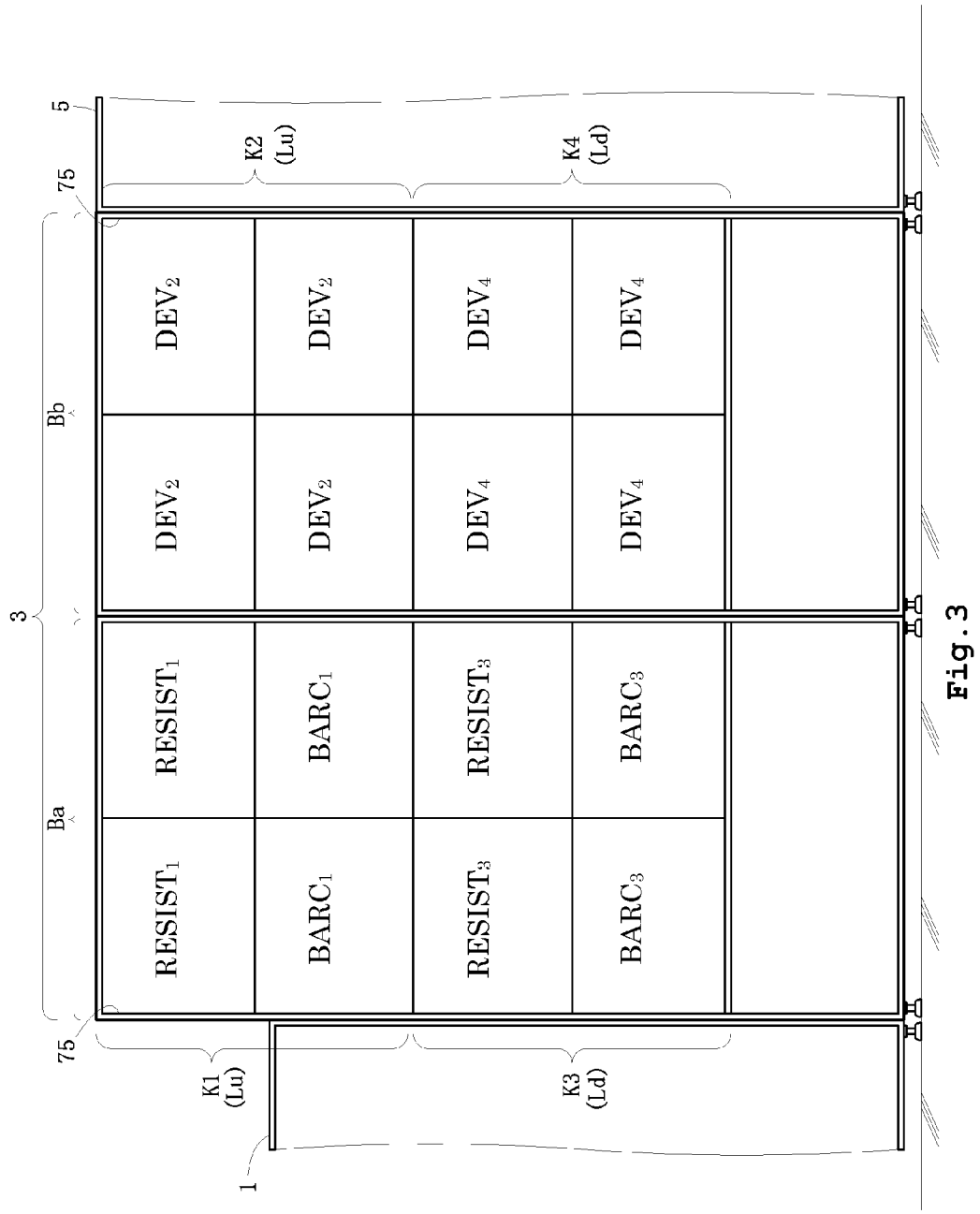
FIG. 3 is a schematic side view showing an arrangement of treating units included in the substrate treating apparatus.
Figure 4:
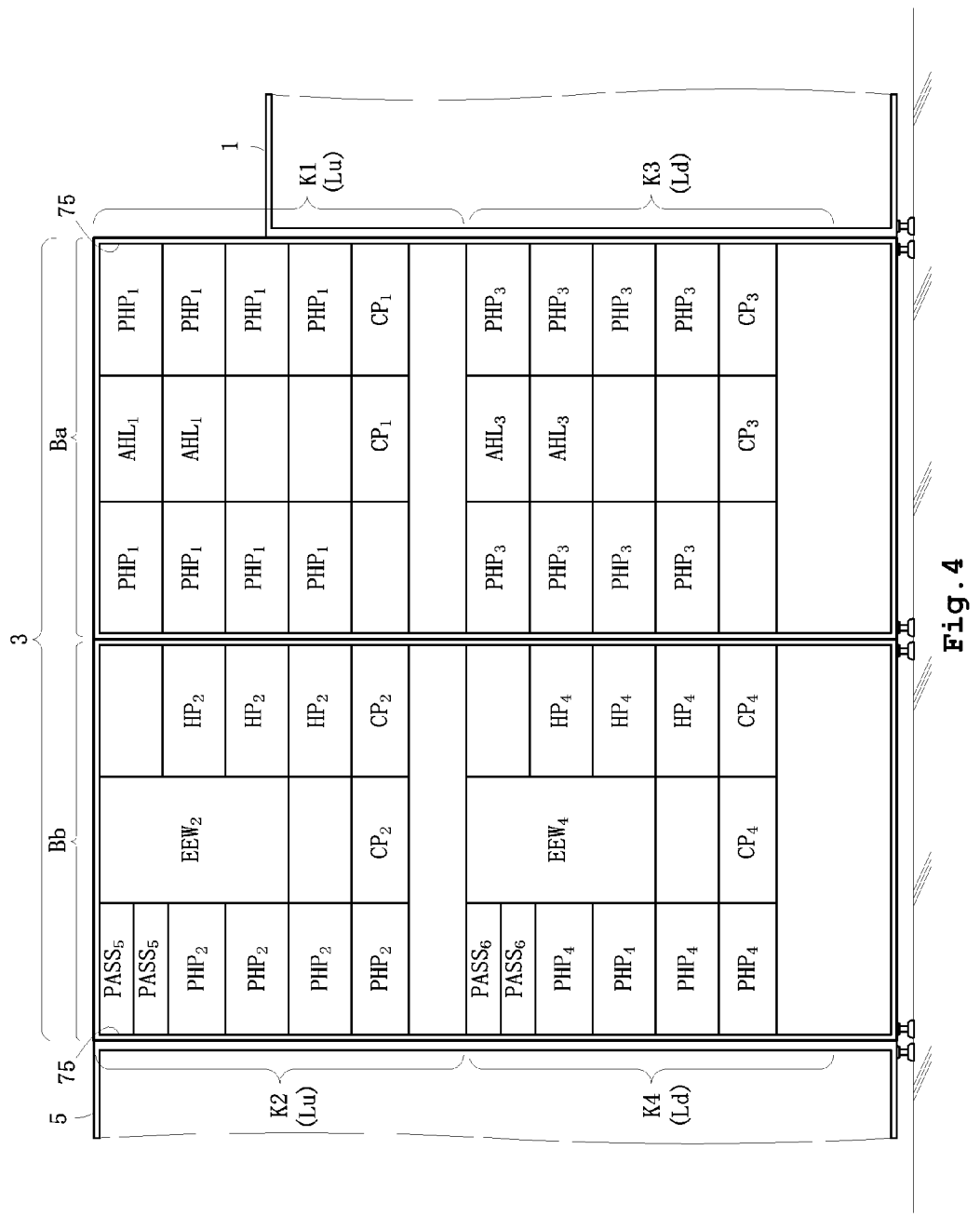
FIG. 4 is a schematic side view showing an arrangement of treating units included in the substrate treating apparatus.

This embodiment will be described in greater detail hereinafter. FIG. 2 is a plan view showing an outline of the substrate treating apparatus according to this embodiment. FIGS. 3 and 4 are schematic side views showing an arrangement of treating units included in the substrate treating apparatus. FIGS. 5 through 8 are views in vertical section taken on lines a-a, b-b, c-c and d-d of FIG. 2, respectively.

ID Section 1

Figure 5:
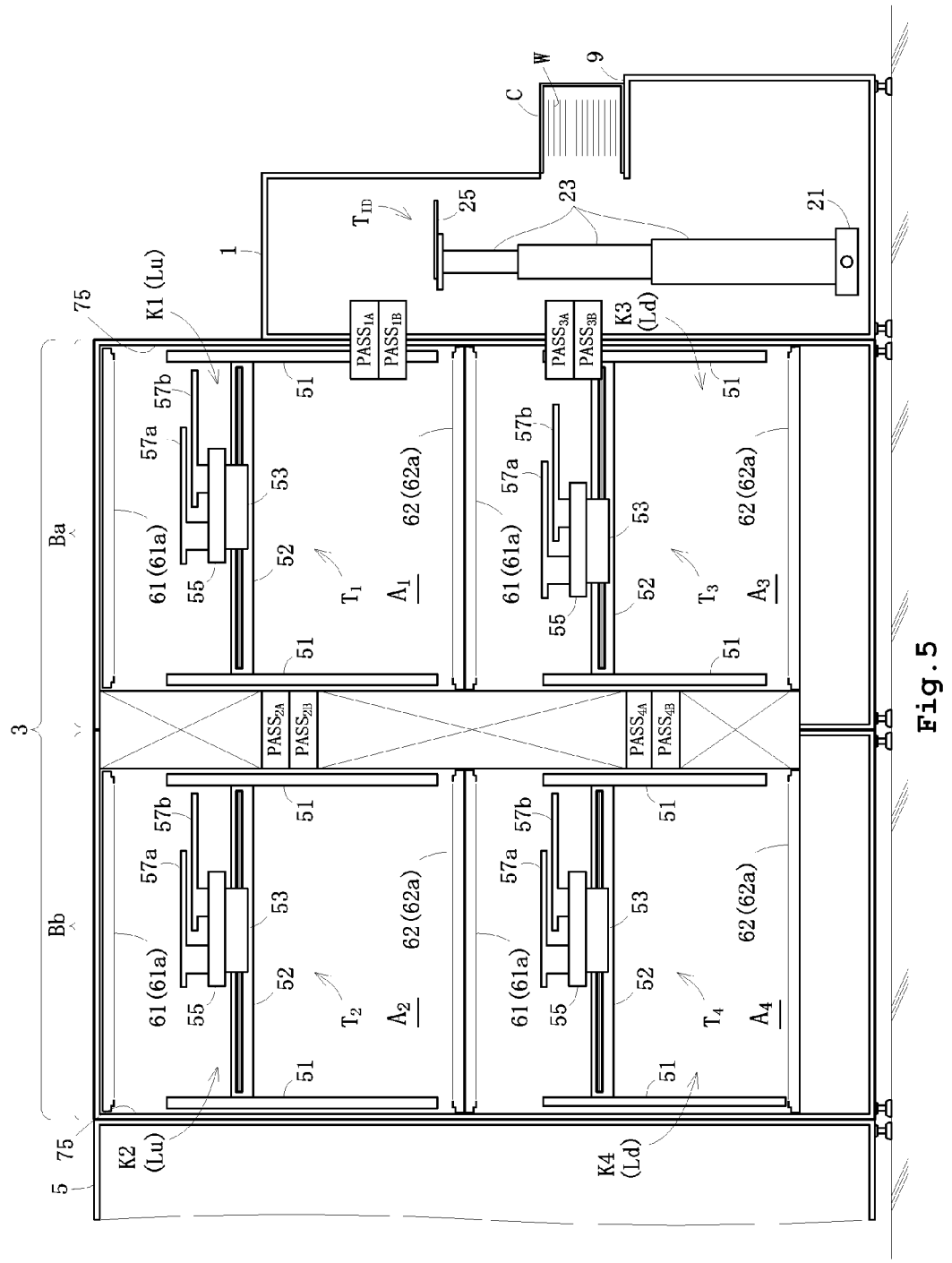
FIG. 5 is a view in vertical section taken on line a-a of FIG. 2.

The ID section 1 takes wafers W out of each cassette C which stores a plurality of wafers W and deposits wafers W in the cassette C. The ID section 1 has a cassette table 9 for receiving cassettes C. The cassette table 9 can receive four cassettes C as arranged in a row. The ID section 1 has also an ID transport mechanism $T_{ID}$. As shown in FIG. 5, the ID transport mechanism $T_{ID}$ transports wafers W to and from each cassette C, and transports wafers W to and from receivers $PASS_1$ and $PASS_3$ to be described hereinafter. The ID transport mechanism $T_{ID}$ has a movable base 21 for moving horizontally alongside the cassette table 9 in the direction of arrangement of the cassettes C, a lift shaft 23 vertically extendible and contractible relative to the movable base 21, and a holding arm 25 swivelable on the lift shaft 23, and extendible and retractable radially of the swivel motion, for holding a wafer W.

Treating Section 3

Each substrate treatment line L of the treating section is constructed to transport wafers W in a substantially horizontal direction between the ID section 1 and IF section 5. Each substrate treatment line L has main transport mechanisms T for transporting wafers W. In this embodiment, each substrate treatment line L has a plurality of main transport mechanisms T (two for each substrate treatment line L, and thus a total of four). The main transport mechanisms T provided for the same substrate treatment line L are arranged in the direction in which the wafers W are transported, and the wafers W can be transferred between the main transport mechanisms T adjacent each other in the transport direction. Each main transport mechanism T transports wafers W to and from various treating units described hereinafter, and transfers wafers W to and from the other main transport mechanism T adjacent thereto.

Specifically, the substrate treatment line Lu includes a main transport mechanism $T_1$ and a main transport mechanism $T_2$ arranged in a row. The main transport mechanism $T_1$ is disposed adjacent to the ID section, while the main transport mechanism $T_2$ is disposed adjacent to the IF section 5. Similarly, the substrate treatment line Ld includes a main transport mechanism $T_3$ and a main transport mechanism $T_4$ arranged in a row. The main transport mechanism $T_3$ is disposed adjacent to the ID section, while the main transport mechanism $T_4$ is disposed adjacent to the IF section 5.

In this embodiment, the treating section 3 which has the above substrate treatment lines L includes a plurality of (two) treating blocks Ba and Bb arranged side by side (in substantially the same direction as the transport direction). The treating block Ba is located adjacent the ID section 1, while the treating block Bb is located adjacent the IF section 5. Each of the treating blocks Ba and Ba is vertically divided into a plurality of (two) stories K. The upper story K1 of the treating block Ba has the main transport mechanism $T_1$ noted above, and the lower story K3 has the main transport mechanism $T_3$. Similarly, the upper story K2 of the treating block Bb has the main transport mechanism $T_2$, and the lower story K4 has the main transport mechanism $T_4$. The story K1 and story K2 are at the same height, and the story K3 and story K4 are at the same height. In this sense, the story K1 and story K2 are "the same stories" and the story K3 and story K4 are "the same stories".

The main transport mechanisms $T_1$ and $T_2$ on the same stories K1 and K2 of the adjoining treating blocks Ba and Bb can transfer wafers W to and from each other. The stories K1 and K2 constitute the substrate treatment line Lu. Similarly, the main transport mechanisms $T_3$ and $T_4$ can transfer wafers W to and from each other. The stories K3 and K4 constitute the substrate treatment line Ld.

Treating Section 3—Treating Block Ba

Receivers $PASS_1$ and $PASS_3$ for receiving wafers W are provided between the ID section 1 and the respective stories K1 and K3 of the treating block Ba. The receiver $PASS_1$ receives, as temporarily placed thereon, wafers W passed between the ID transport mechanism $T_{ID}$ and the main transport mechanism $T_1$. Similarly, the receiver $PASS_3$ receives, as temporarily placed thereon, wafers W passed between the ID transport mechanism $T_{ID}$ and the main transport mechanism $T_3$. Seen in a sectional view, the receiver $PASS_1$ is disposed at a height adjacent a lower part of the upper story K2, while the receiver $PASS_3$ is disposed at a height adjacent an upper part of the lower story K3. Thus, the positions of receiver $PASS_1$ and receiver $PASS_3$ are relatively close to each other for allowing the ID transport mechanism $T_{ID}$ to move between the receiver $PASS_1$ and receiver $PASS_3$ through using only a small amount of vertical movement.

Receivers $PASS_2$ and $PASS_4$ for receiving wafers W are provided also between the treating blocks Ba and Bb. The receiver $PASS_2$ is disposed between the story K1 and story K2, and the receiver $PASS_4$ between the story K3 and story K4. The main transport mechanisms $T_1$ and $T_2$ transfer wafers W through the receiver $PASS_2$, and the main transport mechanisms $T_3$ and $T_4$ through the receiver $PASS_4$.

The receiver $PASS_1$ includes a plurality of receivers (two in this embodiment). These receivers $PASS_1$ are arranged vertically adjacent each other. Of the two receivers $PASS_1$, one $PASS_{1A}$ receives wafers W passed from the ID transport mechanism $T_{ID}$ to the main transport mechanism $T_1$. The other receiver $PASS_{1B}$ receives wafers W passed from the main transport mechanism $T_1$ to the ID transport mechanism $T_{ID}$. Each of the receivers $PASS_2$-$PASS_4$ and receivers $PASS_5$ and $PASS_6$ described hereinafter similarly includes a plurality of (two) receivers, one of which is selected according to a direction for transferring wafers W. Each of the receivers $PASS_{1A}$ and $PASS_{1B}$ has a sensor (not shown) for detecting presence or absence of a wafer W. Based on detection signals of each sensor, the transfer of wafers W by the ID transport mechanism $T_{ID}$ and main transport mechanism $T_1$ is controlled. Similar sensors are attached also to the receivers $PASS_2$-$PASS_6$, respectively.

The story K1 will now be described. The main transport mechanism $T_1$ is movable in a transporting space A1 extending substantially through the center of the story K1 and parallel to the direction of transport. The story K1 has, arranged thereon, coating units 31 for applying a treating solution to wafers W, and heat-treating units 41 for heat-treating the wafers W. The coating units 31 are arranged on one side of the transporting space $A_1$, while the heat-treating units 41 are arranged on the other side thereof.

The coating units 31 are arranged vertically and horizontally, each facing the transporting space $A_1$. In this embodiment, four coating units 31 in total are arranged in two columns and two rows.

The coating units 31 include anti-reflection film coating units BARC for applying an anti-reflection film material to the wafers W, and resist film coating units RESIST for applying a resist film material to the wafers W. In this specification, the treatment carried out in the anti-reflection film coating units BARC is referred to as anti-reflection film material coating treatment as appropriate, and the treatment carried out in the resist film coating units RESIST is referred to as resist film material coating treatment as appropriate.

The plurality of (two) anti-reflection film coating units BARC are arranged at substantially the same height in the lower row. The plurality of resist film coating units RESIST are arranged at substantially the same height in the upper row. No dividing wall or partition is provided between the antireflection film coating units BARC. That is, all the antireflection film coating units BARC are only housed in a common chamber, and the atmosphere around each antireflection film coating unit BARC is not blocked off (i.e. is in communication). Similarly, the atmosphere around each resist film coating unit RESIST is not blocked off.

Figure 9A:
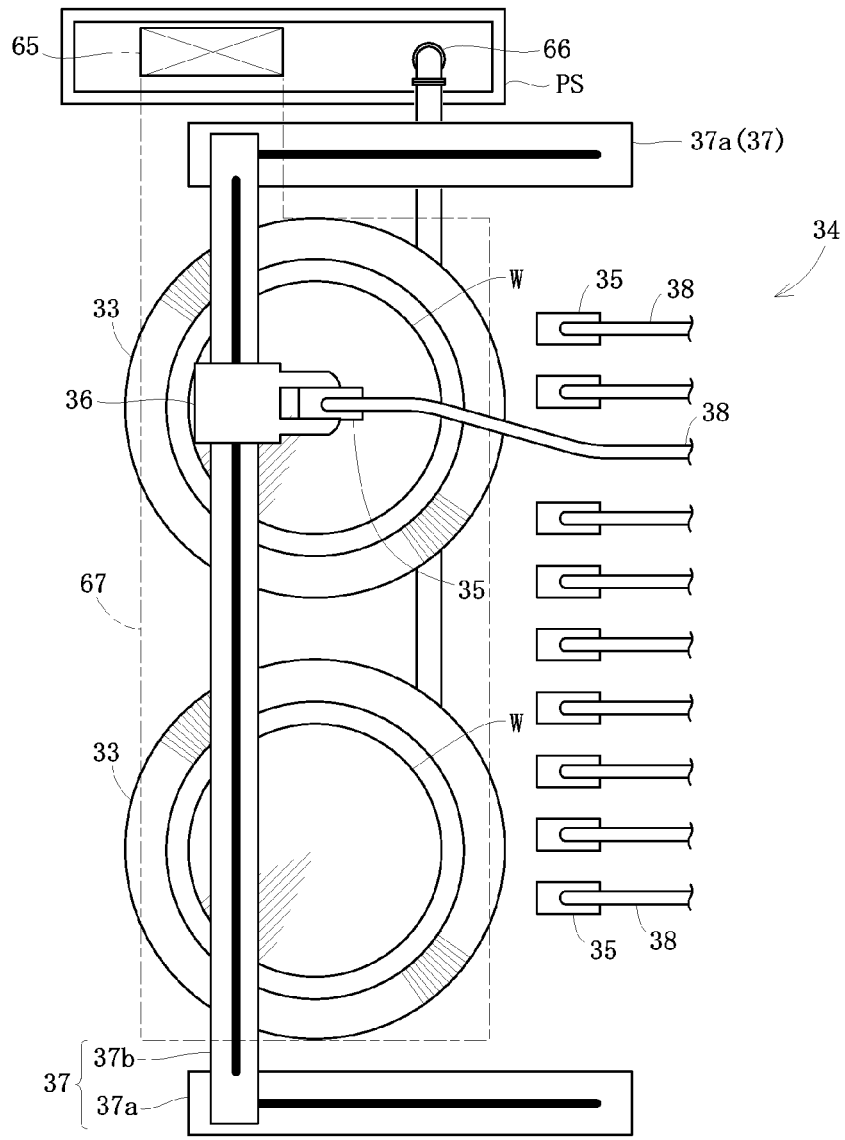
FIG. 9A is a plan view of coating units.
Figure 9B:
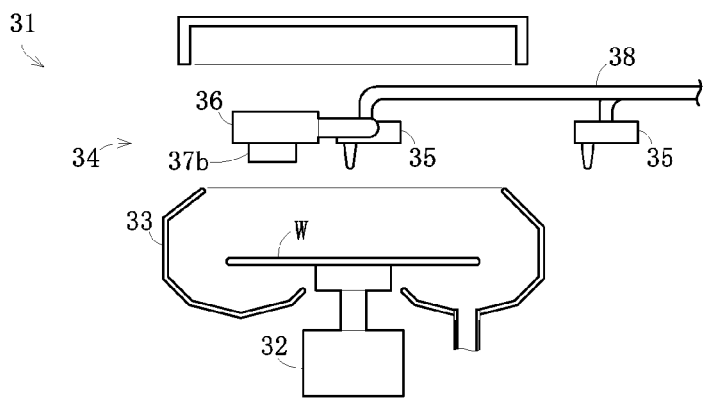
FIG. 9B is a sectional view of a coating unit.

Reference is made to FIGS. 9A and 9B. FIG. 9A is a plan view of the coating units 31. FIG. 9B is a sectional view of a coating unit 31. Each coating unit 31 includes a spin holder 32 for holding and spinning a wafer W, a cup 33 surrounding the wafer W, and a supply device 34 for supplying a treating solution to the wafer W.

The supply device 34 includes a plurality of nozzles 35, a gripper 36 for gripping one of the nozzles 35, and a nozzle moving mechanism 37 for moving the gripper 36 to move one of the nozzles 35 between a treating position above the wafer W and a standby position away from above the wafer W. Each nozzle 35 has one end of a treating solution pipe 38 connected thereto. The treating solution pipe 38 is arranged movable (flexible) to permit movement of the nozzle 35 between the standby position and treating position. The other end of each treating solution pipe 38 is connected to a treating solution source (not shown). Specifically, in the case of antireflection film coating units BARC, the treating solution sources supply different types of treating solution for antireflection film to the respective nozzles 35. In the case of resist film coating units RESIST, the treating solution sources supply different types of resist film material to the respective nozzles 35.

The nozzle moving mechanism 37 has first guide rails 37a and a second guide rail 37b. The first guide rails 37a are arranged parallel to each other and opposed to each other across the two cups 33 arranged sideways. The second guide rail 37b is slidably supported by the two first guide rails 37a and disposed above the two cups 33. The gripper 36 is slidably supported by the second guide rail 37b. The first guide rails 37a and second guide rail 37b take guiding action substantially horizontally and in directions substantially perpendicular to each other. The nozzle moving mechanism 37 further includes drive members (not shown) for sliding the second guide rail 37b, and sliding the gripper 36. The drive members are operable to move the nozzle 35 gripped by the gripper 36 to the treating positions above the two spin holders 32.

Figure 6:
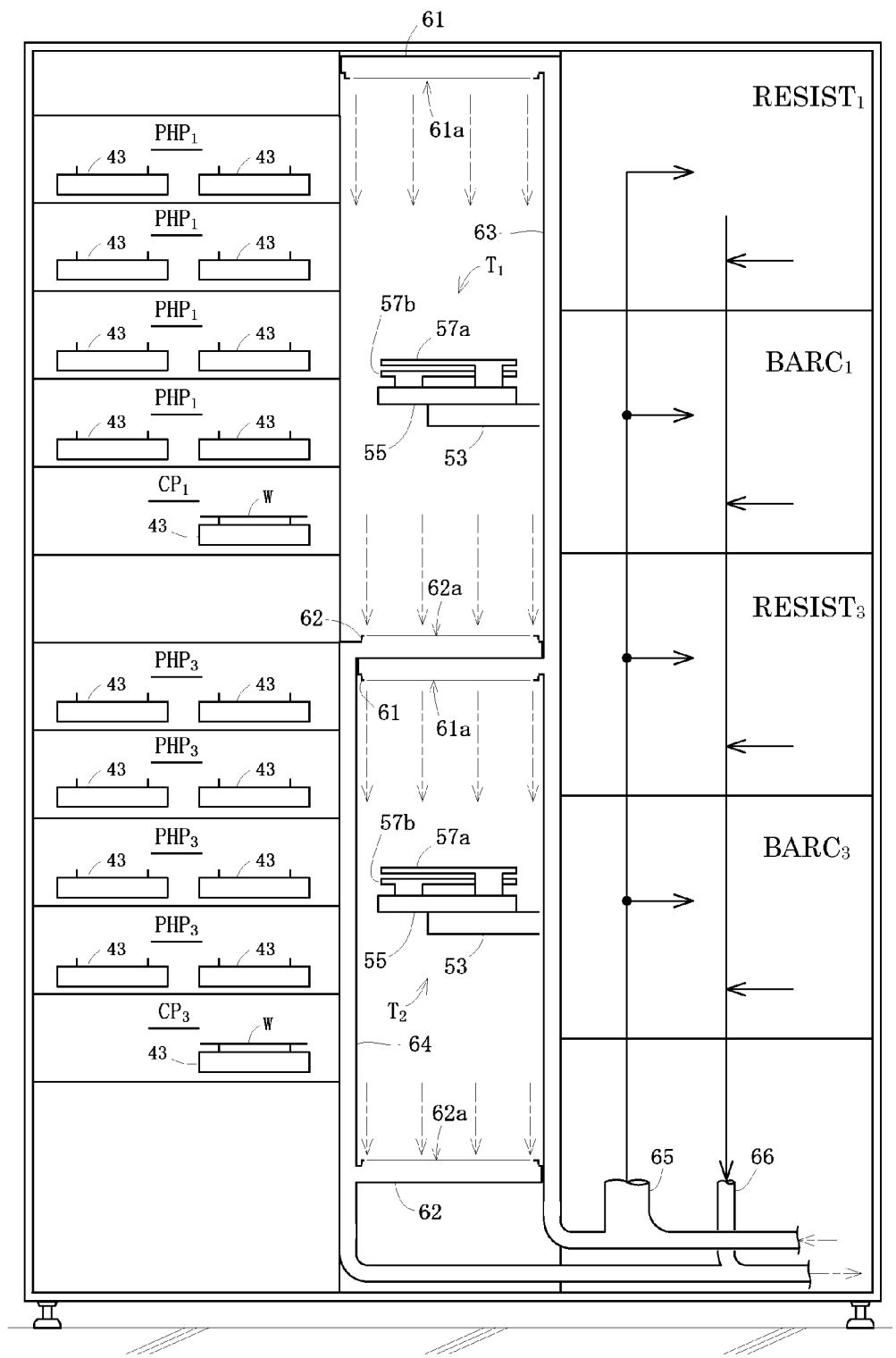
FIG. 6 is a view in vertical section taken on line b-b of FIG. 2.

The plurality of heat-treating units 41 are arranged vertically and horizontally, each facing the transporting space A1. In this embodiment, three heat-treating units 41 can be arranged horizontally, and five heat-treating units 41 can be stacked vertically. Each heat-treating unit 41 has a plate 43 for receiving a wafer W. The heat-treating units 41 include cooling units CP for cooling wafers W, heating and cooling units PHP for carrying out heating and cooling treatments continually, and adhesion units AHL for heat-treating wafers W in an atmosphere of hexamethyldisilazane (HMDS) vapor in order to promote adhesion of coating film to the wafers W. As shown in FIG. 6, each heating and cooling unit PHP has two plates 43, and a local transport mechanism (not shown) for moving a wafer W between the two plates 43. The various types of heat-treating units CP, PHP and AHL are arranged in appropriate positions. In this specification, the treatment carried out in the heating and cooling units PHP is referred to as heating/cooling treatment as appropriate.

Figure 10:
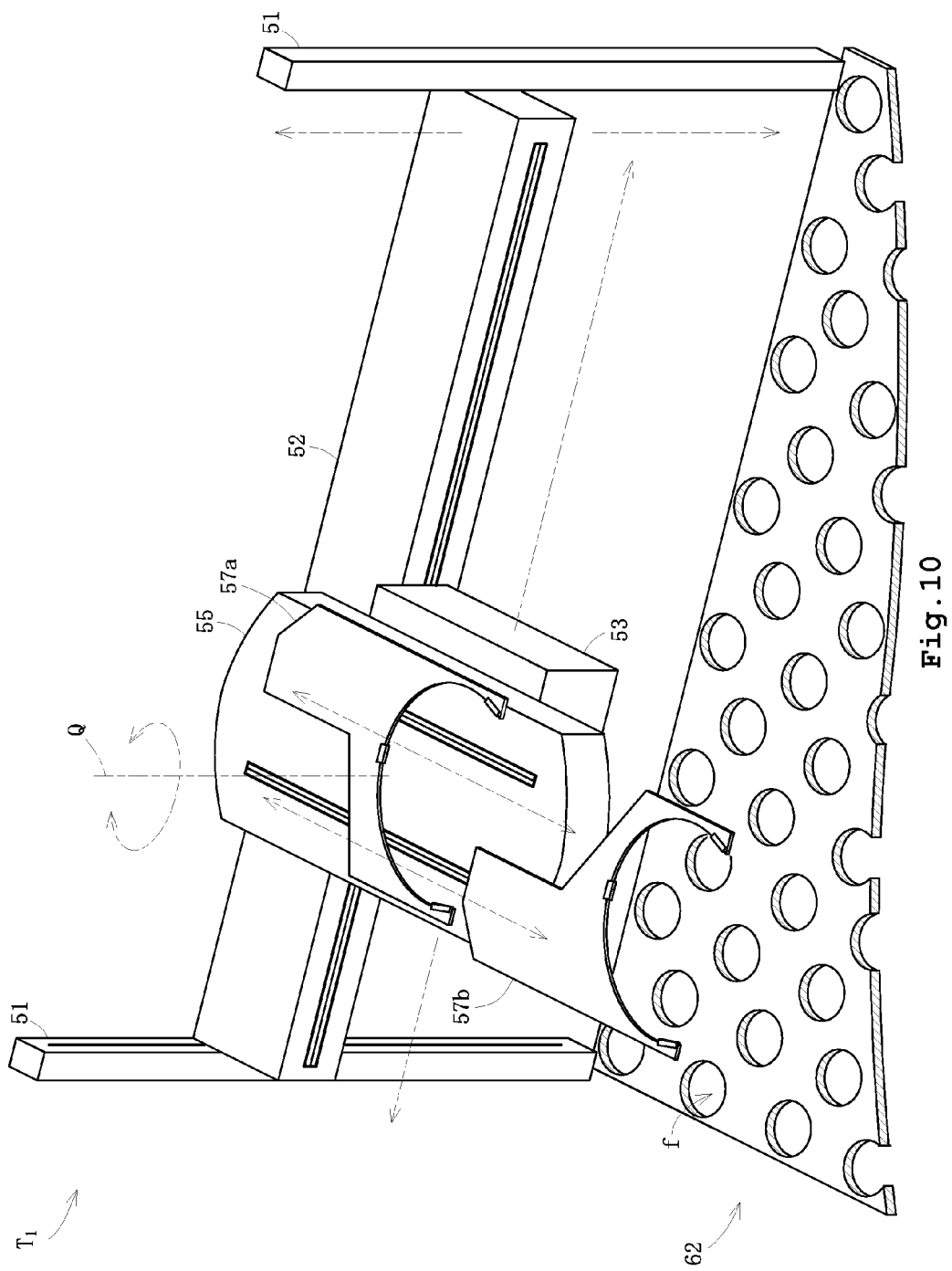
FIG. 10 is a perspective view of a main transport mechanism.

The main transport mechanism $T_1$ will be described specifically. Reference is made to FIG. 10. FIG. 10 is a perspective view of the main transport mechanism $T_1$. The main transport mechanism $T_1$ has two third guide rails 51 for providing vertical guidance, and a fourth guide rail 52 for providing horizontal guidance. The third guide rails 51 are fixed opposite each other at one side of the transporting space $A_1$. In this embodiment, the third guide rails 51 are arranged at the side adjacent the coating units 31. The fourth guide rail 52 is slidably attached to the third guide rails 51. The fourth guide rail 52 has a base 53 slidably attached thereto. The base 53 extends transversely, substantially to the center of the transporting space $A_1$. Further, drive members (not shown) are provided for vertically moving the fourth guide rail 52, and horizontally moving the base 53. The drive members are operable to move the base 53 to positions for accessing the coating units 31 and heat-treating units 41 arranged vertically and horizontally.

The base 53 has a turntable 55 rotatable about a vertical axis Q. The turntable 55 has two holding arms 57a and 57b horizontally movably attached thereto for holding wafers W, respectively. The two holding arms 57a and 57b are arranged vertically close to each other. Further, drive members (not shown) are provided for rotating the turntable 55, and moving the holding arms 57a and 57b. The drive members are operable to move the turntable 55 to positions opposed to the coating units 31, heat-treating units 41 and receivers $PASS_1$ and $PASS_2$, and to extend and retract the holding arms 57a and 57b to and from the coating units 31 and so on.

The story K3 will be described next. Like reference numerals are used to identify like parts which are the same as in the story K1, and will not be described again. The layout (arrangement) in plan view of the main transport mechanism $T_3$ and treating units in the story K3 is substantially the same as in the story K1. Thus, the arrangement of the various treating units of the story K3 as seen from the main transport mechanism $T_3$ is substantially the same as the arrangement of the various treating units of the story K1 as seen from the main transport mechanism $T_1$. The coating units 31 and heat-treating units 41 of the story K3 are stacked under the coating units 31 and heat-treating units 41 of the story K1, respectively.

In the following description, when distinguishing the resist film coating units RESIST in the stories K1 and K3, subscripts "1" and "3" will be affixed (for example, the resist film coating units RESIST in the story K1 will be referred to as "resist film coating units $RESIST_1$").

The other aspects of the treating block Ba will be described. As shown in FIGS. 5 and 6, each of the transporting spaces $A_1$ and $A_3$ has a first blowout unit 61 for blowing out a clean gas, and an exhaust unit 62 for sucking the gas. Each of the first blowout unit 61 and exhaust unit 62 is in the form of a flat box having substantially the same area as the transporting space $A_1$ in plan view. Each of the first blowout unit 61 and exhaust unit 62 has first blowout openings 61a or exhaust openings 62a formed in one surface thereof. In this embodiment, the first blowout openings 61a or exhaust openings 62a are in the form of numerous small bores f (see FIG. 10). The first blowout units 61 are arranged over the transporting spaces $A_1$ and $A_3$ with the first blowout openings 61a directed downward. The exhaust units 62 are arranged under the transporting spaces $A_1$ and $A_3$ with the exhaust openings 62a directed upward. The atmosphere in the transporting space $A_1$ and the atmosphere in the transporting space $A_3$ are blocked off by the exhaust unit 62 of the transporting space $A_1$ and the first blowout unit 61 of the transporting space $A_3$. Thus, each of the stories K1 and K3 has the atmosphere blocked off from the other.

The first blowout units 61 of the transporting spaces $A_1$ and $A_3$ are connected to a common, first gas supply pipe 63. The first gas supply pipe 63 extends laterally of the receivers $PASS_2$ and $PASS_4$ from an upper position of the transporting space $A_1$ to a lower position of the transporting space $A_3$, and is bent below the transporting space $A_3$ to extend horizontally. The other end of the first gas supply pipe 63 is connected to a gas source not shown. Similarly, the exhaust units 62 of the transporting spaces $A_1$ and $A_3$ are connected to a common, first gas exhaust pipe 64. The first gas exhaust pipe 64 extends laterally of the receivers $PASS_2$ and $PASS_4$ from a lower position of the transporting space $A_1$ to a lower position of the transporting space $A_3$, and is bent below the transporting space $A_2$ to extend horizontally. As the gas is blown out of each first blowout opening 61a and sucked and exhausted through each exhaust opening 62a of the transporting spaces $A_1$ and $A_3$, gas currents are formed to flow from top to bottom of the transporting spaces $A_1$ and $A_3$, thereby keeping each of the transporting spaces $A_1$ and $A_3$ in a clean state.

Figure 7:
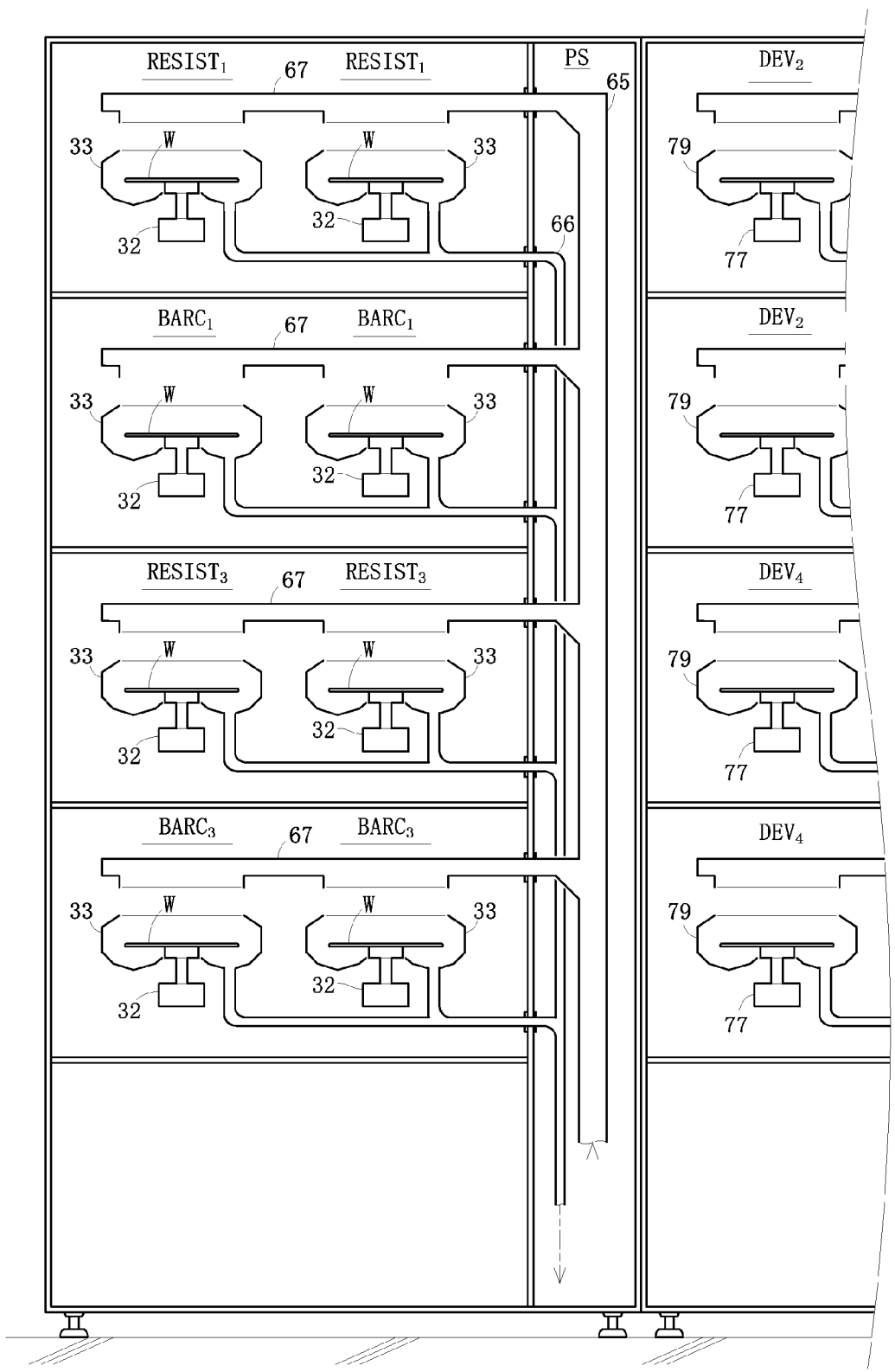
FIG. 7 is a view in vertical section taken on line c-c of FIG. 2.

As shown in FIGS. 2, 7 and 9A, each coating unit 31 of the stories K1 and K3 has a pit portion PS extending vertically. The pit portion PS accommodates a second gas supply pipe 65 extending vertically for supplying the clean gas, and a second gas exhaust pipe 66 extending vertically for exhausting the gas. Each of the second gas supply pipe 65 and second gas exhaust pipe 66 branches at a predetermined height in each coating unit 31 to extend substantially horizontally from the pit portion PS. A plurality of branches of the second gas supply pipe 65 are connected to second blowout units 67 for blowing out the gas downward. A plurality of branches of the second gas exhaust pipe 66 are connected for communication to the bottoms of the respective cups 33. The other end of the second gas supply pipe 65 is connected to the first gas supply pipe 63 below the story K3. The other end of the second gas exhaust pipe 66 is connected to the first gas exhaust pipe 64 below the story K3. As the gas is blown out of the second blowout units 67 and exhausted through the second exhaust pipes 62a, the atmosphere inside each cup 33 is constantly maintained clean, thereby allowing for excellent treatment of the wafer W held by the spin holder 32.

The pit portions PS further accommodate piping of the treating solutions, electric wiring and the like (not shown). Thus, with the pit portions PS accommodating the piping and electric wiring provided for the coating units 31 of the stories K1 and K3, the piping and electric wiring can be reduced in length.

The treating block Ba has one housing 75 for accommodating the main transport mechanisms $T_1$ and $T_3$, coating units 31 and heat-treating units 41 described hereinbefore. The treating block Bb described hereinafter also has a housing 75 for accommodating the main transport mechanisms $T_2$ and $T_4$ and the treating units included in the treating block Bb. The housing 75 of the treating block Ba and the housing 75 of the treating block Bb are separate entities. Thus, with each of the treating blocks Ba and Bb having the housing 75 accommodating the main transport mechanisms T and treating units U en bloc, the treating section 3 may be manufactured and assembled simply. The treating block Ba corresponds to the coating block in this invention. The treating block Ba corresponds also to the first treating block in this invention.

Treating Section 3—Treating Block Bb

The story K2 will be described. Like reference numerals are used to identify like parts which are the same as in the story K1 and will not be described again. The story K2 has a transporting space $A_2$ formed as an extension of the transporting space $A_1$.

The story K2 has, arranged thereon, developing units DEV for supplying a developing solution to wafers W, heat-treating units 42 for heat-treating the wafers W, and an edge exposing unit EEW for exposing peripheral regions of the wafers W. The developing units DEV are arranged at one side of the transporting space $A_2$, and the heat-treating units 42 and edge exposing unit EEW are arranged at the other side of the transporting space $A_2$. Preferably, the developing units DEV are arranged at the same side as the coating units 31. It is also preferable that the heat-treating units 42 and edge exposing unit EEW are arranged in the same row as the heat-treating units 41. In this specification, the treatment carried out in the developing units DEV is referred to as developing treatment as appropriate, and the treatment carried out in the edge exposing unit EEW is referred to as edge exposure as appropriate.

The number of developing units DEV is four, and sets of two units DEV arranged horizontally along the transporting space A2 are stacked one over the other. As shown in FIGS. 2 and 7, each developing unit DEV includes a spin holder 77 for holding and spinning a wafer W, and a cup 79 surrounding the wafer W. The two developing units DEV arranged at the lower level are not separated from each other by a partition wall or the like. A supply device 81 is provided for supplying developers to the two developing units DEV. The supply device 81 includes two slit nozzles 81a having a slit or a row of small bores for delivering the developers. The slit or row of small bores, preferably, has a length corresponding to the diameter of wafer W. Preferably, the two slit nozzles 81a are arranged to deliver developers of different types or concentrations. The supply device 81 further includes a moving mechanism 81b for moving each slit nozzle 81a. Thus, the slit nozzles 81a are movable, respectively, over the two spin holders 77 juxtaposed sideways.

The plurality of heat-treating units 42 are arranged sideways along the transporting space $A_2$, and stacked one over the other. The heat-treating units 42 include heating units HP for heating wafers W, cooling units CP for cooling wafers W, and heating and cooling units PHP for carrying out heating/cooling treatment.

The plurality of heating and cooling units PHP are vertically stacked in the column closest to the IF section 5, each having one side facing the IF section 5. The heating and cooling units PHP on the story K2 have transport ports formed in the sides thereof for passage of wafers W. IF transport mechanisms $T_{IF}$ to be described hereinafter transport wafers W through the above transport ports to the heating and cooling units PHP. The heating and cooling units PHP arranged on the story K2 carry out post-exposure baking (PEB) treatment. Thus, the heating/cooling treatment carried out in the heating and cooling units PHP on the story K2 in particular is referred to as PEB treatment. Similarly, the heating/cooling treatment carried out in the heating and cooling units PHP on the story K4 in particular is referred to as PEB treatment.

The single edge exposing unit EEW is disposed in a predetermined position. The edge exposing unit EEW includes a spin holder (not shown) for holding and spinning a wafer W, and a light emitter (not shown) for exposing edges of the wafer W held by the spin holder.

The receiver PASS$_5$ is formed on top of the heating and cooling units PHP. The main transport mechanism $T_2$ and IF transport mechanisms $T_{IF}$ to be described hereinafter transfer wafers W through the receiver PASS$_5$.

The main transport mechanism $T_2$ is disposed substantially centrally of the transporting space $A_2$ in plan view. The main transport mechanism $T_2$ has the same construction as the main transport mechanism $T_1$. The main transport mechanism $T_2$ transports wafers W to and from the receiver PASS$_2$, various heat-treating units 42, edge exposing unit EEW and receiver PASS$_5$.

The story K4 will be described briefly. The relationship in construction between story K2 and story K4 is similar to that between stories K1 and K3. The treating units U on the story K4 are developing units DEV, heat-treating units 42 and an edge exposing unit EEW. The heat-treating units 42 on the story K4 include heating units HP, cooling units CP and heating and cooling units PHP. The receiver PASS$_6$ is formed on top of the heating and cooling units PHP on the story K4. The main transport mechanism $T_4$ and IF transport mechanisms $T_{IF}$ described hereinafter transfer wafers W through the receiver PASS$_6$. The heating and cooling units PHP on the story K4 also carry out post-exposure baking (PEB) treatment.

In the following description, when distinguishing the developing units DEV, edge exposing units EEW and so on provided on the stories K2 and K4, subscripts "2" and "4" will be affixed (for example, the heating units HP on the story K2 will be referred to as "heating units HP$_2$").

Each of the transporting spaces $A_2$ and $A_4$ of the stories K2 and K4 also has constructions corresponding to the first blowout unit 61 and exhaust unit 62. Each developing unit DEV of the stories K2 and K4 also has constructions corresponding to the second blowout unit 67 and second gas exhaust pipe 66.

The treating block Bb constructed in this way corresponds to the developing block in this invention. The treating block Bb corresponds also to the second treating block in this invention.

IF Section 5

The IF section 5 transfers wafers W between each of the substrate treatment lines Lu and Ld (stories K2 and K4) of the treating section 3 and the exposing machine EXP. The IF section 5 has IF transport mechanisms $T_{IF}$ for transporting wafers W. The IF transport mechanisms $T_{IF}$ include a first transport mechanism $T_{IFA}$ and a second transport mechanism $T_{IFB}$ that can transfer wafers W to and from each other. The first transport mechanism $T_{IFA}$ transports wafers W to and from the substrate treatment lines Lu and Ld. In this embodiment, as described hereinbefore, the first transport mechanism $T_{IFA}$ transports wafers W to and from the receivers PASS$_5$ and PASS$_6$ on the stories K2 and K4, and to and from the heating and cooling units PHP on the stories K3 and K4. The second transport mechanism $T_{IFB}$ transports wafers W to and from the exposing machine EXP.

As shown in FIG. 2, the first transport mechanism $T_{IFA}$ and second transport mechanism $T_{IFB}$ are arranged in a transverse direction perpendicular to the transport direction of the substrate treatment lines L. The first transport mechanism $T_{IFA}$ is disposed at the side where the heat-treating units 42 and so on of the stories K2 and K4 are located. The second transport mechanism $T_{IFB}$ is disposed at the side where the developing units DEV of the stories K2 and K4 are located. Provided between the first and second transport mechanisms $T_{IFA}$ and $T_{IFB}$ are a receiver PASS-CP for receiving and cooling wafers W, a receiver PASS$_7$ for receiving wafers W, and buffers BF for temporarily storing wafers W. The buffers BF can receive or store a plurality of wafers W. The first and second transport mechanisms $T_{IFA}$ and $T_{IFB}$ transfer wafers W through the receiver PASS-CP and receiver PASS$_7$. The buffers BF are accessed exclusively by the first transport mechanism $T_{IFA}$.

Figure 8:
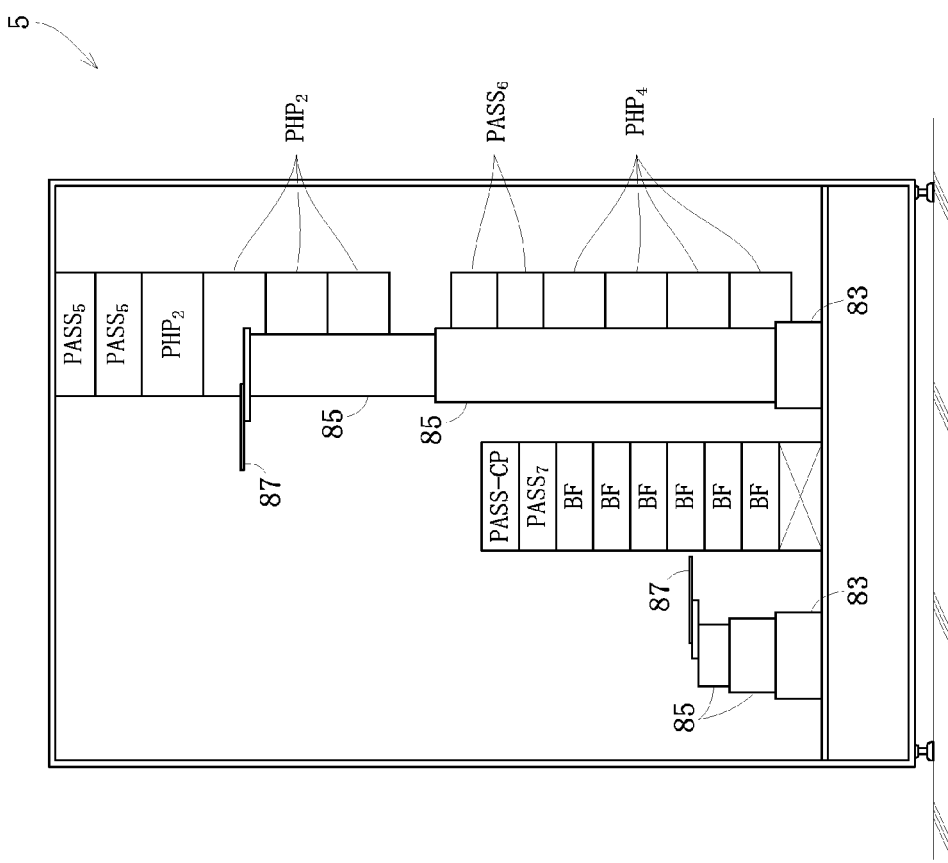
FIG. 8 is a view in vertical section taken on line d-d of FIG. 2.

As shown in FIG. 8, the first transport mechanism $T_{IFA}$ includes a fixed base 83, lift shafts 85 vertically extendible and contractible relative to the base 83, and a holding arm 87 swivelable on the lift shafts 85, and extendible and retractable radially of the swivel motion, for holding a wafer W. The second transport mechanism $T_{IFB}$ also has a base 83, lift shafts 85 and a holding arm 87.

Figure 11:
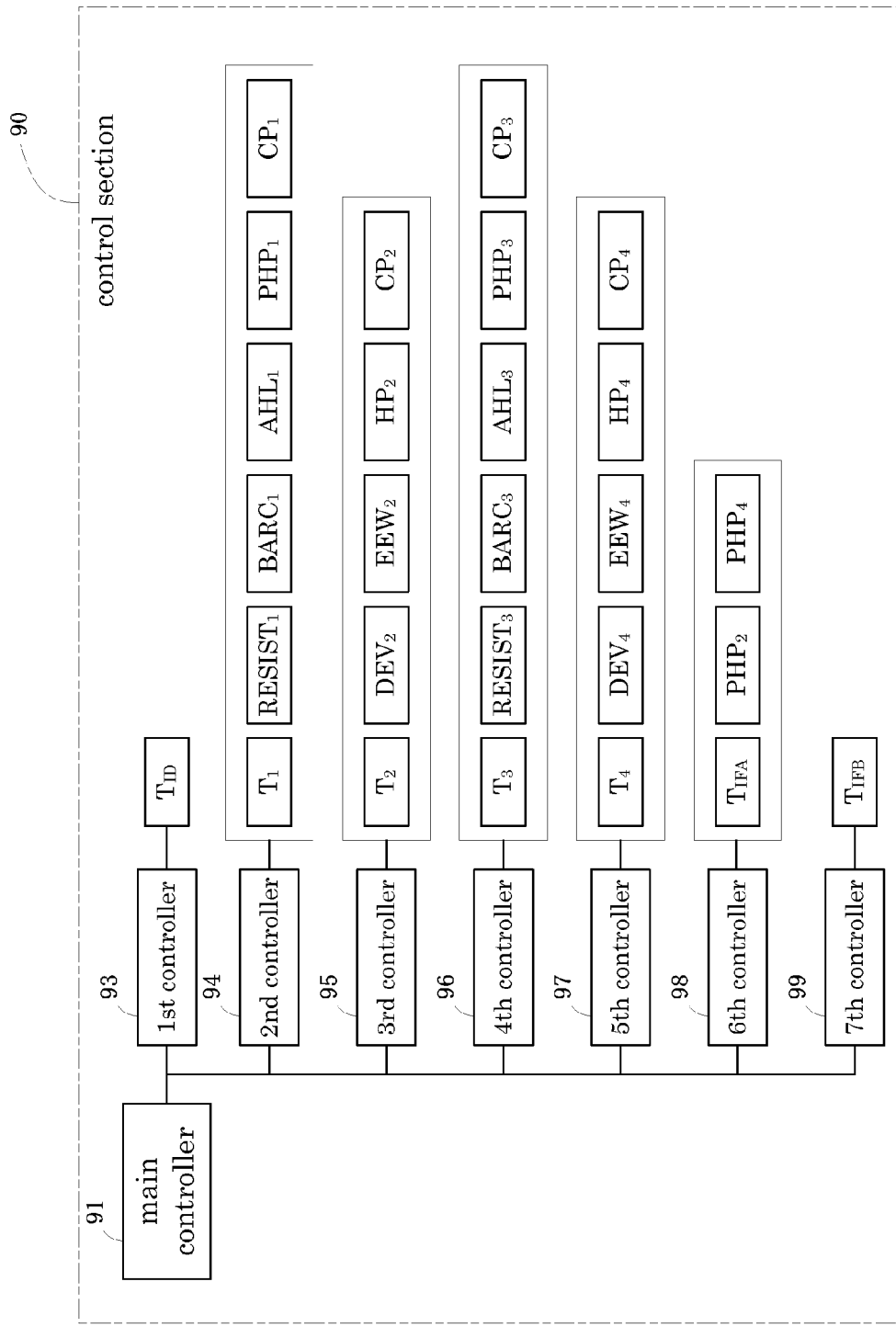
FIG. 11 is a control block diagram of the substrate treating apparatus according to the invention.

A control system of this apparatus 10 will be described next. FIG. 11 is a control block diagram of the substrate treating apparatus according to the invention. As shown, the control section 90 of this apparatus 10 includes a main controller 91 and a first to a seventh controllers 93, 94, 95, 96, 97, 98 and 99.

The main controller 91 performs overall control of the first to seventh controllers 93-99. The first controller 93 controls substrate transport by the ID transport mechanism $T_{ID}$. The second controller 94 controls substrate transport by the main transport mechanism $T_1$, and substrate treatment in the resist film coating units RESIST$_1$, antireflection film coating units BARC$_1$, cooling units CP$_1$, heating and cooling units PHP$_1$ and adhesion units AHL$_1$. The third controller 95 controls substrate transport by the main transport mechanism $T_2$, and substrate treatment in the edge exposing unit EEW$_2$, developing units DEV$_2$, heating units HP$_2$ and cooling units CP$_2$. The controls by the fourth and fifth controllers 96 and 97 correspond to those by the second and third controllers 94 and 95, respectively. The sixth controller 98 controls substrate transport by the first transport mechanism $T_{IFA}$, and substrate treatment in the heating and cooling units PHP$_2$ and PHP$_4$. The seventh controller 99 controls substrate transport by the second transport mechanism $T_{IFB}$. The first to seventh controllers 93-99 carry out the controls independently of one another.

Each of the main controller 91 and the first to seventh controllers 93-99 is realized by a central processing unit (CPU) which performs various processes, a RAM (Random Access Memory) used as the workspace for operation processes, and a storage medium such as a fixed disk. The storage medium stores a variety of information including a predetermined processing recipe (processing program), and information specifying an order of wafers W to be loaded into the treating section 3.

Figure 12:
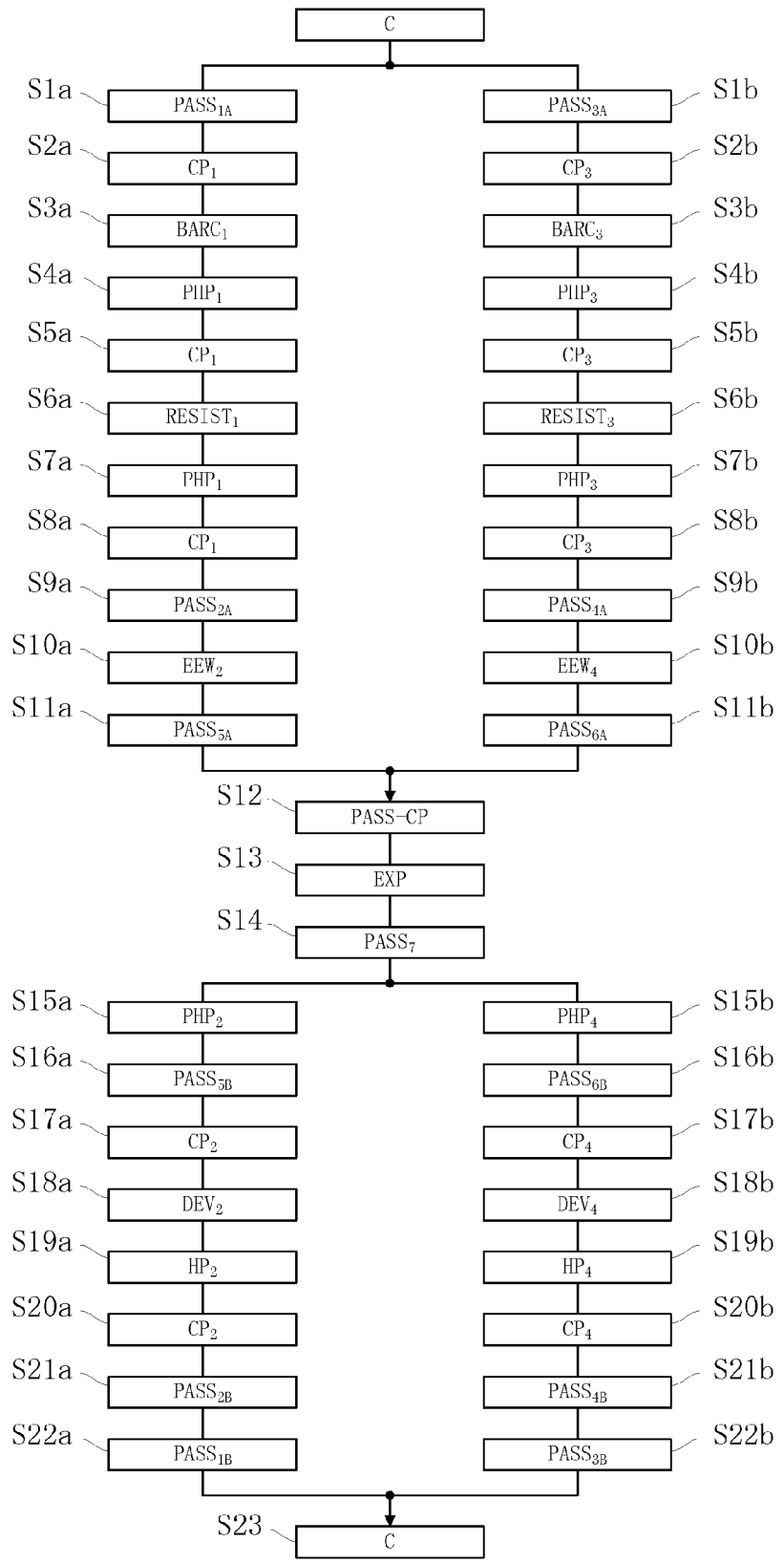
FIG. 12 is a flow chart of a series of treatments of substrates.
Figure 13:
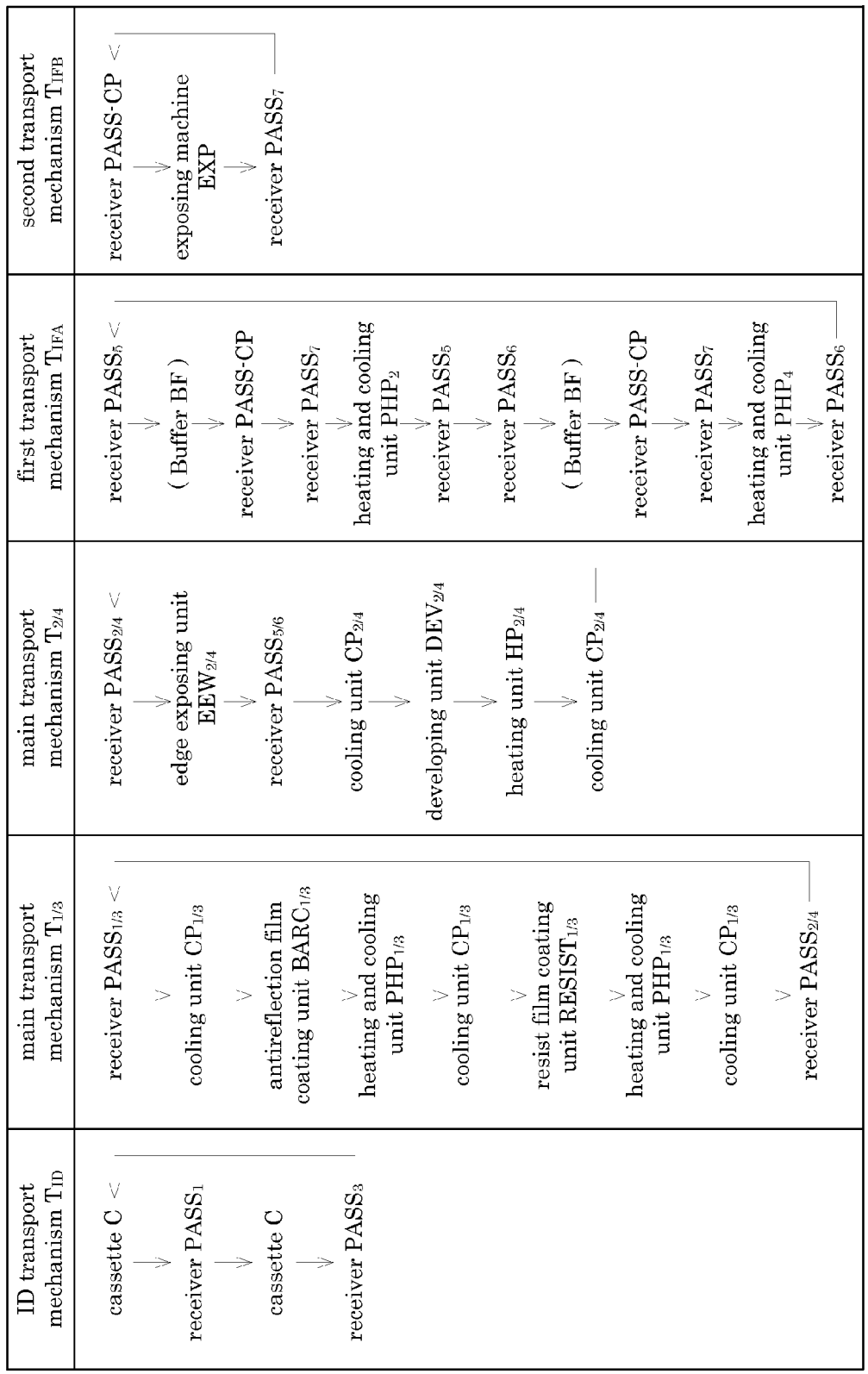
FIG. 13 is a view schematically showing operations repeated by each transport mechanism.

Next, operation of the substrate treating apparatus in this embodiment will be described. FIG. 12 is a flow chart of a series of treatments of wafers W, indicating the treating units and receivers to which the wafers W are transported in order. FIG. 13 is a view schematically showing operations repeated by each transport mechanism, and specifying an order of treating units, receivers and cassettes accessed by the transport mechanisms. The following description will be made separately for each transport mechanism. FIGS. 12 and 13 show an example of basic operation where the order OD of wafers W the IF section 5 receives from the treating section 3 is the same as the order OA of wafers W transported from the ID section 1 to the treating section 3. An operation taking place where the order OD is different from the order OA will be described in connection with operation of IF transport mechanisms $T_{IF}$.

ID Transport Mechanism $T_{ID}$

The ID transport mechanism $T_{ID}$ moves to a position opposed to one of the cassettes C, holds with the holding arm 25 a wafer W to be treated and takes the wafer W out of the cassette C. The ID transport mechanism $T_{ID}$ swivels the holding arm 25, vertically moves the lift shaft 23, moves to a position opposed to the receiver PASS$_1$, and places the wafer W on the receiver PASS$_{1A}$ (which corresponds to step S1$a$ in FIG. 12; only step numbers will be indicated hereinafter). At this time, a wafer W usually is present on the receiver PASS$_{1B}$, and the ID transport mechanism $T_{ID}$ receives this wafer W and stores it in a cassette C (step S23). When there is no wafer W on the receiver PASS$_{1B}$, step S23 is omitted. Then, the ID transport mechanism $T_{ID}$) accesses the cassette C, and transports a wafer W from the cassette C to the receiver PASS$_{3A}$ (step S1$b$). Here again, if a wafer W is present on the receiver PASS$_{3B}$, the ID transport mechanism $T_{ID}$) will store this wafer W in a cassette C (step S23). The ID transport mechanism $T_{ID}$ repeats the above operation.

This operation of the ID transport mechanism $T_{ID}$ is controlled by the first controller 93. As a result, the wafers W in the cassette C are fed to the story K1, and the wafers W delivered from the story K1 are stored in the cassette C. Similarly, the wafers W in the cassette C are fed to the story K3, and the wafers W delivered from the story K3 are stored in the cassette C.

Main Transport Mechanisms $T_1$, $T_3$

Since operation of the main transport mechanism $T_3$ is substantially the same as operation of the main transport mechanism $T_1$, only the main transport mechanism $T_1$ will be described. The main transport mechanism $T_1$ moves to a position opposed to the receiver PASS$_1$. At this time, the main transport mechanism $T_1$ holds, on one holding arm 57 (e.g. 57$b$), a wafer W received immediately before from the receiver PASS$_{2B}$. The main transport mechanism $T_1$ places this wafer W on the receiver PASS$_{1B}$ (step S22), and holds the wafer W present on the receiver PASS$_{1A}$ with the other holding arm 57 (e.g. 57$a$).

The main transport mechanism $T_1$ accesses one of the cooling units CP$_1$. There is a different wafer W having already received cooling treatment in the cooling unit CP$_1$. The main transport mechanism $T_1$ holds the different wafer W with the unloaded holding arm 57 (holding no wafer W), takes it out of the cooling unit CP$_1$, and loads into the cooling unit CP$_1$ the wafer W having received from the receiver PASS$_{1A}$. Then, the main transport mechanism $T_1$, holding the cooled wafer W, moves to one of the antireflection film coating units BARC$_1$. The cooling unit CP$_1$ starts cooling treatment of the wafer W loaded therein (step S2). This heat treatment (cooling) will have been finished by the time the main transport mechanism $T_1$ accesses this cooling unit CP$_1$ next time. The following description assumes that wafers W having received predetermined treatments are present also in the other, different heat-treating units 41 and coating units 31 when the main transport mechanism $T_1$ makes access thereto.

Accessing the antireflection film coating unit BARC$_1$, the main transport mechanism $T_1$ takes a wafer W having antireflection film formed thereon from the antireflection film coating unit BARC$_1$, and places the cooled wafer W on the spin holder 32 of the antireflection film coating unit BARC$_1$. Then, the main transport mechanism $T_1$, holding the wafer W having antireflection film formed thereon, moves to one of the heating and cooling units PHP$_1$. The antireflection film coating unit BARC$_1$ starts antireflection film material coating treatment of the wafer W placed on the spin holder 32 (step S3$a$).

Specifically, the spin holder 32 spins the wafer W in horizontal posture, the gripper 26 grips one of the nozzles 35, the nozzle moving mechanism 37 moves the gripped nozzle 35 to a position above the wafer W, and the treating solution for antireflection film is supplied from the nozzle 35 to the wafer W. The treating solution supplied spreads all over the wafer W, and is scattered away from the wafer W. The cup 33 collects the scattering treating solution. In this way, the treatment is carried out for forming antireflection film on the wafer W.

Accessing the heating and cooling unit $PHI'_1$, the main transport mechanism $T_1$ takes a wafer W having received heat treatment out of the heating and cooling unit $PHP_1$, and loads the wafer W having antireflection film formed thereon into the heating and cooling unit $PHP_1$. Then, the main transport mechanism $T_1$, holding the wafer W taken out of the heating and cooling unit $PHP_1$, moves to one of the cooling units $CP_1$. The heating and cooling unit $PHP_1$ receives a wafer W successively on the two plates 43, to heat the wafer W on one of the plates 43 and then to cool the wafer W on the other plate 43 (step S4a).

Having moved to the cooling unit $CP_1$, the main transport mechanism $T_1$ takes a wafer W out of the cooling unit $CP_1$, and loads the wafer W held by the transport mechanism $T_1$ into the cooling unit $CP_1$. The cooling unit $CP_1$ cools the wafer W loaded therein (step S5a).

Then, the main transport mechanism $T_1$ moves to one of the resist film coating units $RESIST_1$. The main transport mechanism $T_1$ takes a wafer W having resist film formed thereon from the resist film coating unit $RESIST_1$, and loads the wafer W held by the main transport mechanism $T_1$ into the resist film coating unit $RESIST_1$. The resist film coating unit $RESIST_1$, while spinning the wafer W loaded therein, applies the resist film material to the wafer W (step S6a).

The main transport mechanism $T_1$ further moves to one of the heating and cooling units $PHP_1$ and one of the cooling units $CP_1$. The main transport mechanism $T_1$ loads the wafer W having resist film formed thereon into the heating and cooling unit $PHP_1$, transfers a wafer W treated in the heating and cooling unit $PHP_1$ to the cooling unit $CP_1$, and receives a wafer W treated in the cooling unit $CP_1$. The heating and cooling unit $PHP_1$ and cooling unit $CP_1$ carry out predetermined treatments of newly loaded wafers W, respectively (steps S7a and S8a).

The main transport mechanism $T_1$ moves to the receiver $PASS_2$, places the wafer W it is holding on the receiver $PASS_{2A}$ (step S9a), and receives a wafer W present on the receiver $PASS_{2B}$ (step S21a).

Subsequently, the main transport mechanism $T_1$ accesses the receiver $PASS_1$ again, and repeats the above operation. This operation is controlled by the second controller 94. As a result, all the wafers W transported from the cassette C to the receiver $PASS_1$ are transported to and from the various treating units through the transport path on the story K1 to receive the predetermined treatment successively in the treating units to which the wafers W are transported.

The main transport mechanism $T_1$ transports a wafer W having been transported to the receiver $PASS_1$ to a predetermined treating unit (a cooling unit $CP_1$ in this embodiment), and takes a treated wafer W from this treating unit. Subsequently, the main transport mechanism $T_1$ transports the wafer W taken out to a next treating unit (an antireflection film coating unit $BARC_1$), and takes a treated wafer W from this treating unit. In this way, the treatment is carried out in parallel for a plurality of wafers W by transferring a treated wafer W from each treating unit to a new treating unit. Starting with a wafer W first placed on the receiver $PASS_1$, the wafers W are successively placed on the receiver $PASS_2$ to be fed to the story K2. Similarly, the wafers W are placed on the receiver $PASS_1$ in the order of placement on the receiver $PASS_2$ to be fed to the ID section 1.

Main Transport Mechanisms $T_2$, $T_4$

Since operation of the main transport mechanism $T_4$ is substantially the same as operation of the main transport mechanism $T_2$, only the main transport mechanism $T_2$ will be described. The main transport mechanism $T_2$ moves to a position opposed to the receiver $PASS_2$. At this time, the main transport mechanism $T_2$ holds a wafer W received from a cooling unit $CP_2$ accessed immediately before. The main transport mechanism $T_2$ places this wafer W on the receiver $PASS_{2B}$ (step S21a), and holds the wafer W present on the receiver $PASS_{2A}$ (step S9a).

The main transport mechanism $T_2$ accesses the edge exposing unit $EEW_2$. The main transport mechanism $T_2$ receives a wafer W having received a predetermined treatment in the edge exposing unit $EEW_2$, and loads the cooled wafer W into the edge exposing unit $EEW_2$. While spinning the wafer W loaded therein, the edge exposing unit $EEW_2$ irradiates peripheral regions of the wafer W with light from the light emitter not shown, thereby exposing the peripheral regions of the wafer W (step S10a).

The main transport mechanism $T_2$, holding the wafer W received from the edge exposing unit $EEW_2$, accesses the receiver $PASS_5$. The main transport mechanism $T_2$ places the wafer W on the receiver $PASS_{5A}$ (step S11a), and holds a wafer W present on the receiver $PASS_{5B}$ (step S16a).

The main transport mechanism $T_2$ moves to one of the cooling units $CP_2$, and replaces a wafer W in the cooling unit $CP_2$ with the wafer W held by the main transport mechanism $T_2$. The main transport mechanism $T_2$ holds the wafer W having received cooling treatment, and accesses one of the developing units $DEV_2$. The cooling unit $CP_2$ starts treatment of the newly loaded wafer W (step S17a).

The main transport mechanism $T_2$ takes a developed wafer W from the developing unit $DEV_2$, and places the cooled wafer W on the spin holder 77 of the developing unit $DEV_2$. The developing unit $DEV_2$ develops the wafer W placed on the spin holder 77 (step S18a). Specifically, while the spin holder 77 spins the wafer W in horizontal posture, the developer is supplied from one of the slit nozzles 81a to the wafer W, thereby developing the wafer W.

The main transport mechanism $T_2$ holds the developed wafer W, and accesses one of the heating units $HP_2$. The main transport mechanism $T_2$ takes a wafer W out of the heating unit $HP_2$, and loads the wafer W it is holding into the heating unit $HP_2$. Then, the main transport mechanism $T_2$ transports the wafer W taken out of the heating unit $HP_2$ to one of the cooling units $CP_2$, and takes out a wafer W already treated in this cooling unit $CP_2$. The heating unit $HP_2$ and cooling unit $CP_2$ carry out predetermined treatments for the newly loaded wafers W, respectively (steps S19a and S20a).

Subsequently, the main transport mechanism $T_2$ accesses the receiver $PASS_2$ again, and repeats the above operation. This operation is controlled by the third controller 95. As a result, the wafers W are forwarded to the receiver $PASS_{5A}$ in the order in which they are placed on the receiver $PASS_{5A}$. Similarly, the wafers W are forwarded to the receiver $PASS_{2B}$ in the order in which they are placed on the receiver $PASS_{5B}$.

IF Transport Mechanisms $T_{IF}$—First Transport Mechanism $T_{IFA}$ and Second Transport Mechanism $T_{IFB}$ When a wafer W is forwarded to the receiver $PASS_5$, the sensor (not shown) provided for the receiver $PASS_5$ detects the wafer W placed on the receiver $PASS_5$. Then, the first transport mechanism $T_{IFA}$ accesses the receiver $PASS_5$, and receives the wafer W placed on the receiver PASS$_{5A}$ (step S11a). At this time, the control section 90 puts the wafer W received by the IF section 5 in a proper place in the order of loading into the treating section 3, so that an order in which wafers W are transported to the exposing machine EXP may agree with the order of wafers loaded into the treating section 3. Specifically, the control section 90 refers to the information specifying the order OA of loading into the treating section 3, and determines whether the wafer W received is a next wafer W to be transported to the exposing machine EXP. According to a result of this determination, the destination of the wafer W received by the first transport mechanism T$_{IFA}$ is changed. Two methods of this determination will be described first, and thereafter operation of first transport mechanism T$_{IFA}$ and second transport mechanism T$_{IFB}$ will be described.

Determining Method 1

The first method will be described with reference to FIG. 14. FIG. 14 is a view schematically showing information for determining the order of wafers W loaded into the treating section 3. FIG. 14 shows information on a relationship of identification information on wafers W matched with the order OA of wafers W loaded into the treating section 3 (hereinafter called "relational information"). In this relational information, "Wa", "Wb", . . . , and "Wh" are identification information which identifies each wafer W, and "1", "2", . . . , and "8" indicate the order OA of loading into the treating section 3. The relational information shown in FIG. 14 corresponds to the example of transport of wafers W shown in FIG. 1.

Based on a wafer W actually received by the first transport mechanism T$_{IFA}$, the control section 90 first acquires identification information applied to that wafer W. The control section 90 refers to the above relational information, and determines a place in the order OA matched with the identification information acquired. Further, the control section 90 determines a place in the order of the next wafer W to be transported to the exposing machine EXP, by counting a total of wafers W already transported to the exposing machine EXP. Then, the control section 90 determines whether the determined place in the order OA and the place in the order of the next wafer W to be transported to exposing machine EXP are in agreement. When they are found in agreement, the control section 90 determines that the wafer W received is the next wafer W to be transported to the exposing machine EXP. When not in agreement, the control section 90 determines that the wafer W received is not the next wafer W to be transported to the exposing machine EXP.

For example, if the identification information on the wafer W received by the first transport mechanism T$_{IFA}$ is "Wb", the place in the order OA matched therewith is "2" (see FIG. 14). If one wafer W has already been transported to the exposing machine EXP when the first transport mechanism T$_{IFA}$ receives this wafer W, the place in the order of the next wafer W to be transported is "2". When the place in the order OA ("2") of the wafer W received by the first transport mechanism T$_{IFA}$ agrees with the next place in the order ("2") for transport to the exposing machine EXP, the wafer W received is determined to be the next wafer W transported to the exposing machine EXP.

Determining Method 2

The second method will be described with reference to FIGS. 15, 16A and 16B. FIG. 15 is a view schematically showing information for determining the order of wafers W loaded into the treating section 3. FIG. 15 shows information on the substrate treatment lines Lu and Ld to which wafers W are transported, and which are selectively matched with the order OA of wafers W loaded into the treating section 3. The relational information shown in FIG. 15 also corresponds to the example of transport of wafers W shown in FIG. 1.

Concerning the substrate treatment lines Lu and Ld, the order of wafers W fed from each of the substrate treatment lines Lu and Ld is the same as the order of wafers W loaded into each of the substrate treatment lines Lu and Ld. Considering this fact, the relational information shown in FIG. 15 leads to the relational information shown in FIGS. 16A and 6B. FIG. 16A is information showing a relationship of the order OA of wafers W loaded into the treating section 3 which is matched with the order OB of wafers W fed from the substrate treatment line Lu to the IF section 5. FIG. 16B is information showing the order OA of wafers W loaded into the treating section 3 which is matched with the order OC of wafers W fed from the substrate treatment line Ld to the IF section 5.

The control section 90 first determines that, when the first transport mechanism T$_{IFA}$ receives a wafer W from the receiver PASS$_5$, the wafer W is fed from the substrate treatment line Lu. At this time, the control section 90 determines the order OB of wafers W fed from the substrate treatment line Lu. Then, the control section 90 refers to the relational information shown in FIG. 15 (or FIG. 16A), and determines the order OA matched with the order OB. On the other hand, the control section 90 determines that, when the first transport mechanism T$_{IFA}$ receives a wafer W from the receiver PASS$_6$, the wafer W is fed from the substrate treatment line Ld, and determines the order OC of wafers W fed from the substrate treatment line Ld. In this case, the control section 90 refers to the relational information shown in FIG. 15 (or FIG. 16B), and determines the order OA matched with the order OC.

The control section 90 determines also the order of wafers W to be transported to the exposing machine EXP. Then, the control section 90 determines whether the place in the order of a wafer W to be transported next to the exposing machine EXP agrees with its place in the order OA. When they are found in agreement, the control section 90 determines that the wafer W received is the next wafer W to be transported to the exposing machine EXP. When not in agreement, the control section 90 determines that the wafer W received is not the next wafer W to be transported to the exposing machine EXP.

For example, if one wafer W has already been received from the receiver PASS$_5$ when the first transport mechanism T$_{IFA}$ receives a wafer W from the receiver PASS$_5$, this wafer W has place "2" in the order OB and place "3" in the order OA (see FIG. 15 or FIG. 16A). If one wafer W has already been transported to the exposing machine EXP when the first transport mechanism T$_{IFA}$ receives this wafer W, the place in the order of the next wafer W to be transported is "2". When the place in the order OA ("3") of the wafer W received by the first transport mechanism T$_{IFA}$ does not agree with the next place in the order ("2") for transport to the exposing machine EXP, the wafer W received is determined not to be the next wafer W transported to the exposing machine EXP.

The relational information shown in FIG. 15 or FIGS. 16A and 16B includes the substrate treatment lines Lu and Ld, but this is not limitative. The technical meaning does not change even if the substrate treatment lines Lu and Ld are replaced by the stories K2 and K4, respectively, for example. That is, even with this replacement, the control section 90 can determine, as in determining method 2 described above, whether a wafer W received is the next wafer W to be transported to the exposing machine EXP.

When a determination is made, with determining method 1 or 2 described above, that a wafer W received is the next wafer W to be transported to the exposing machine EXP, the control section 90 carries out the following control. The first transport mechanism $T_{IFA}$ holds the wafer W received, moves to the receiver PASS-CP, and loads the wafer W into the PASS-CP (step S12). Then, the second transport mechanism $T_{IFB}$ takes the wafer W out of the receiver PASS-CP, and transports it to the exposing machine EXP. The wafer W is exposed in the exposing machine EXP (step S13).

On the other hand, when a determination is made that the wafer W received is not the next wafer W to be transported to the exposing machine EXP, the control section 90 carries out the following control. The first transport mechanism $T_{IFA}$ holds the wafer W received, moves to the buffers BF, and places the wafer W in one of the buffers BF. (This step is omitted from FIG. 12. See FIG. 13.)

The control section 90 determines whether the wafer W placed in the buffer BF is now the next wafer W to be transported to the exposing machine EXP. The control section 90 determines a place in the order OA of each wafer W placed in a buffer BF when the wafer W is received from the treating section 3. Therefore, the order OA already determined is compared with the order OE of wafers W to be transported to the exposing machine EXP, to determine whether they are in agreement for each wafer W. When in agreement, the control section 90 determines that the wafer W is the next one to be transported to the exposing machine EXP.

In this case, the control section 90 carries out the following control. The first transport mechanism $T_{IFA}$ accesses the buffers BF, takes out the wafer W for which the orders are in agreement, and loads the wafer W into the receiver PASS-CP (step S12). Then, the second transport mechanism $T_{IFB}$ takes this wafer W out of the receiver PASS-CP, and transports it to the exposing machine EXP (step S13).

Even when a wafer W placed in a buffer BF is determined to be the next one to be transported to the exposing machine EXP, if a wafer W is being fed from either substrate treatment line L, it is preferable to give priority to receipt of the wafer W fed from the substrate treatment line L.

Reference is made to FIG. 17. FIG. 17 gives views schematically showing how eight wafers W fed from both substrate treatment lines Lu and Ld are transported through the IF section 5 to the exposing machine EXP, the views reflecting the progress of time from (a) to (j). FIGS. 17A through 17J correspond to the example of transport of wafers W shown in FIG. 1.

In the course of time from the point in time of FIG. 17A to the point in time of FIG. 17J, wafers Wa, Wc, We, Wb, Wg, Wd, Wf and Wh are fed in this order from the treating section 3, and wafers Wa, Wb, Wc, Wd, We, Wf, Wg and Wh are transported in this order to the exposing machine EXP.

In FIG. 17A, wafer Wa fed from the substrate treatment line Lu is transported to the exposing machine EXP without being placed in a buffer BF. In FIG. 17D, wafer Wb is transported similarly, and in FIG. 17F, wafer Wd is transported similarly. The substrate transport shown in FIGS. 17A, 17D and 17F is the case where the control section 90 determines that each wafer W received is the next wafer W to be transported to the exposing machine EXP.

In FIG. 17B, wafer Wc fed from the substrate treatment line Lu is placed in a buffer BF. In FIG. 17C, wafer We is transported similarly, in FIG. 17E, wafer Wg is transported similarly, in FIG. 17G, wafer Wf is transported similarly, and in FIG. 17H, wafer Wh is transported similarly. The substrate transport shown in FIGS. 17B, 17C, 17E, 17G and 17H is the case where the control section 90 determines that each wafer W received is not the next wafer W to be transported to the exposing machine EXP.

In FIG. 17E, wafer Wc is transported from the buffer BF to the exposing machine EXP. In FIG. 17G, wafer We is transported similarly, and in FIGS. 17H, 17I and 17J, wafer Wf, wafer Wg and wafer Wh are transported similarly, respectively. The substrate transport shown in FIGS. 17E and 17G through 17J is the case where the control section 90 determines that each wafer W placed in the buffer BF is the next wafer W to be transported to the exposing machine EXP.

At the time of FIG. 17E, wafer Wg is fed from the substrate treatment line Lu, and wafer Wc placed in the buffer BF is determined the next wafer W to be transported to the exposing machine EXP. In such a case, it is preferable to receive wafer Wg fed from the substrate treatment line Lu first, and thereafter to transport wafer Wc to the exposing machine EXP. This permits the substrate treatment line Lu to feed promptly wafer W following wafer Wg (not shown in FIGS. 17A through 17J). As a result, a lowering of substrate transporting efficiency and treating efficiency is prevented. Similarly, in FIG. 17G, it is preferable to receive wafer Wf fed from the substrate treatment line Ld first, and thereafter to transport wafer We to the exposing machine EXP. This permits the substrate treatment line Ld to feed promptly wafer Wh following wafer Wf. In FIG. 17H, it is preferable to receive wafer Wh fed from the substrate treatment line Ld, and thereafter to transport wafer Wf to the exposing machine EXP.

Other operation of the first transport mechanism $T_{IFA}$ will be described. The first transport mechanism $T_{IFA}$ receives a wafer W from the receiver $PASS_7$ (step S14), and moves to a position opposed to one of the heating and cooling units $PHP_2$. The first transport mechanism $T_{IFA}$ takes a wafer W having received PEB treatment from the heating and cooling unit $PHP_2$, and loads the wafer W received from the receiver $PASS_7$ into the heating and cooling unit $PHP_2$. The heating and cooling unit $PHP_2$ carries out heat treatment for the newly loaded wafer W (step 515a).

The first transport mechanism $T_{IFA}$ transports the wafer W taken out of the heating and cooling unit $PHP_2$ to the receiver $PASS_{5B}$. Subsequently, the first transport mechanism $T_{IFA}$ transports a wafer W from the receiver $PASS_{6A}$ to the receiver PASS-CP (Step S11b, S12). Next, the first transport mechanism $T_{IFA}$ transports a wafer W from the receiver $PASS_7$ to one of the heating and cooling units $PHP_4$. At this time, the first transport mechanism $T_{IFA}$ takes out a wafer W having received the PEB treatment in the heating and cooling unit $PHP_4$, and places the wafer W on the receiver $PASS_{6B}$ (steps S14, S15b, S16b).

Subsequently, the first transport mechanism $T_{IFA}$ accesses the receiver $PASS_5$ again and repeats the above operation. This operation is controlled by the sixth controller.

Other operation of the second transport mechanism $T_{IFB}$ will be described. The second transport mechanism $T_{IFB}$ takes a wafer W out of the receiver PASS-CP, and transports it to the exposing machine EXP. The wafer W is exposed in the exposing machine EXP (step S13).

Subsequently, the second transport mechanism $T_{IFB}$ accesses the receiver PASS-CP again and repeats the above operation.

In the substrate treating apparatus according to this embodiment, as described above, the order of wafers W to be transported to the exposing machine EXP is adjusted to the order OA of wafers W loaded into the treating section 3, whereby the order OE of wafers W transported to the exposing machine EXP corresponds to the order OA of loading into the treating section 3. Therefore, each wafer W can be controlled easily. A follow-up check can also be performed easily on the history of treatment of each wafer W in the treating section 3 or the exposing machine EXP.

Since the order (corresponding to the order OD) of wafers W fed from the substrate treatment lines Lu and Ld is adjusted in the IF section 5, there is no need to adjust timing of substrate feeding between the substrate treatment lines Lu and Ld. This allows each of the substrate treatment lines Lu and Ld to proceed with treatment of wafers W independently. Thus, there is no need for coordination between the second and third controllers 94 and 95 which control the substrate treatment line Lu, and the fourth and fifth controllers 96 and 97 which control the substrate treatment line Ld. This enable a reduction in the burden of the controls carried out by the second to fifth controllers 94-97.

When wafers W are fed to the receivers $PASS_5$ and $PASS_6$, the first transport mechanism $T_{IFA}$ will receive the wafers W placed on the receivers $PASS_5$ and $PASS_6$. This enables the substrate treatment lines Lu and Ld (stories K3 and K4) to feed new wafers W immediately, thereby preventing a lowering of the treating efficiency of the substrate treatment lines L due to the feeding of wafers W.

The IF section 5 with the buffers BF can conveniently adjust the order OE of wafers W received by the IF section 5 to the order OD of wafers W transported to the exposing machine EXP. Further, the order OE can be secured effectively since, when a wafer W placed in a buffer BF becomes the next wafer W to be transported to the exposing machine EXP, the control section 90 causes this wafer W to be transported to the exposing machine EXP.

The buffers BF can receive or store a plurality of wafers W, which enables an effective adjustment to the order OE.

The control section 90 refers to the information for determining the order OA of loading into the treating section 3 as illustrated in FIG. 15 or FIGS. 16A and 16B, to determine effectively whether a wafer W received by the first transport mechanism $T_{IFA}$ is the next wafer W to be transported to the exposing machine EXP.

The ID section 1, in loading wafers W into the treating section 3, distributes the wafers W regularly and alternately to the stories K1 and K3 (see FIG. 1). Thus, wafers W can be transported to the substrate treatment lines L at substantially the same pace. This inhibits variations in operation between the substrate treatment lines L.

Embodiments of the present invention are not limited to the foregoing embodiments, but may be modified as follows:

(1) In the foregoing embodiment, the buffers BF is accessible only to the first transport mechanism $T_{IFA}$, and wafers W are transferred from the first transport mechanism $T_{IFA}$ to the second transport mechanism $T_{IFB}$ only through the receiver PASS-CP. The invention is not limited to this construction. For example, the buffers BF may be constructed accessible to the first and second transport mechanisms $T_{IFA}$ and $T_{IFB}$, and wafers W may be transferred between the first and second transport mechanisms $T_{IFA}$ and $T_{IFB}$ through the buffers BF as well as the receiver PASS-CP.

Figure 18:
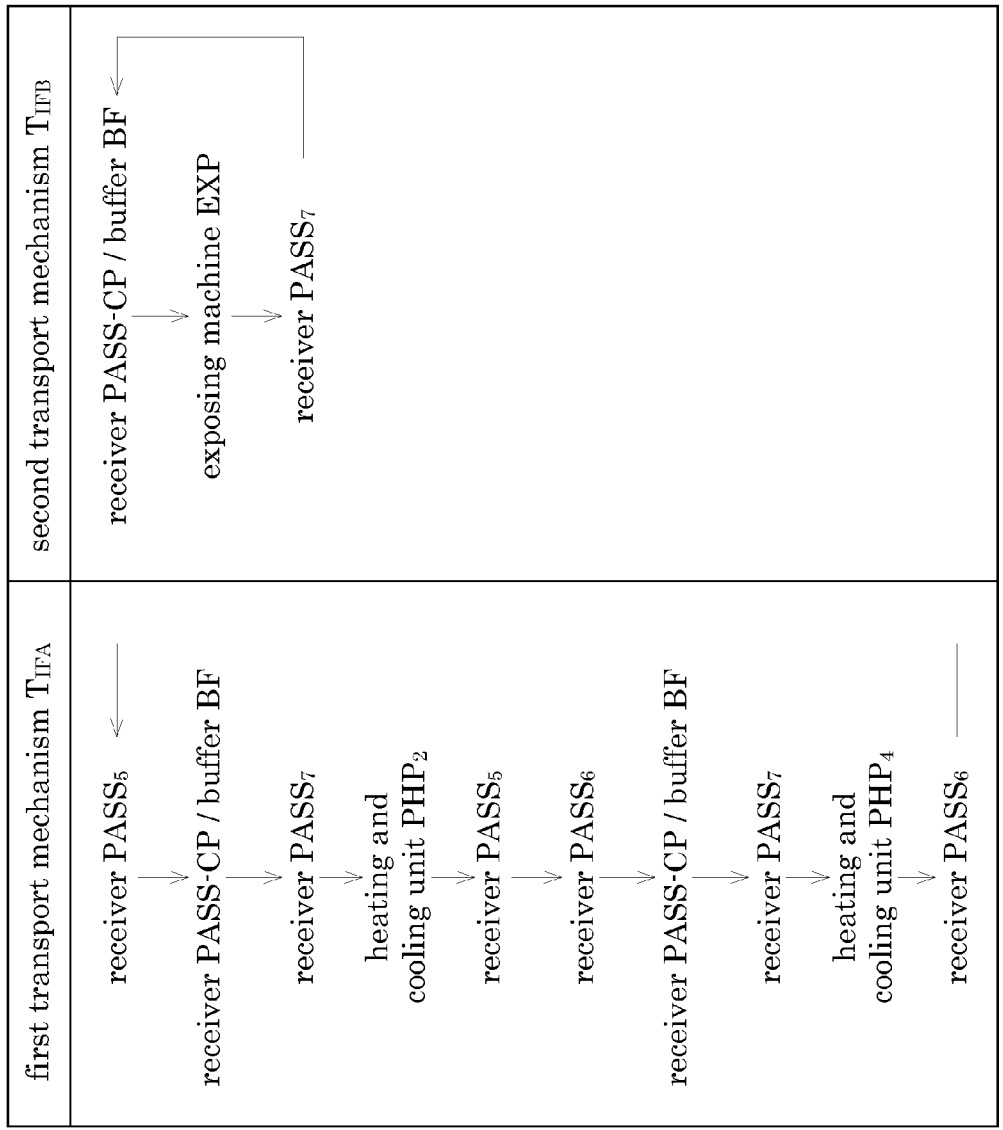
FIG. 18 is a view schematically showing operations repeated by a first and a second transport mechanisms in a modified embodiment.

Specifically, a modification may be made such that, when the control section 90 determines that a wafer W placed in one of the buffers BF has become the next wafer W to be transported to the exposing machine EXP, the second transport mechanism $T_{IFB}$ accesses the buffer BF, takes out the wafer W determined to be in agreement, and transports it to the exposing machine EXP. FIG. 18 is a view schematically showing operations repeated by the first and second transport mechanisms $T_{IFA}$ and $T_{IFB}$ in such a modified embodiment for transporting wafers W as noted above.

This modification can omit the operation of the first transport mechanism $T_{IFA}$ to access the buffer BF in order to take the wafer W out of the buffer BF, thereby improving transporting efficiency. Even if a wafer is fed from one of the substrate treatment lines L when a different wafer W placed in a buffer BF is determined the next wafer W to be transported to the exposing machine EXP, the first transport mechanism $T_{IFA}$ may receive the wafer W from the substrate treatment line L, with the second transport mechanism $T_{IFB}$ transporting the different wafer W to the exposing machine EXP. That is, the first transport mechanism $T_{IFA}$ need not engage in receipt from the substrate treatment line L and transport to the exposing machine EXP in the order of priority as done in the foregoing embodiment. Thus, the control burden of the sixth controller 98 is lightened.

(2) In the foregoing embodiment, the information for determining the order OA of wafers W loaded into the treating section 3 as illustrated in FIGS. 14 and 15 has been described as set to the control section 90 beforehand. The invention is not limited to this. For example, the order OA of loading may be acquired through cooperation with the first controller 91 which controls ID transport mechanism $T_{ID}$.

(3) In the foregoing embodiment, the buffers BF have been described as capable of receiving or storing a plurality of wafers W. Instead, only one wafer W may be received or stored at a time.

(4) In the foregoing embodiment, when the wafer W received by the first transport mechanism $T_{IFA}$ is not the next wafer W to be transported to the exposing machine EXP, the first transport mechanism $T_{IFA}$ simply places the wafer W in one of the buffers BF. Instead, the following arrangement may be adopted. Different buffers BF may be assigned to receiving wafers W fed from each substrate treatment line L. As far as each of the substrate treatment lines Lu and Ld is concerned, wafers W are loaded into and unloaded from each substrate treatment line Lu or Ld in the same order OB or OC. Thus, by placing wafers W fed from the substrate treatment lines L in different buffers BF, the order OE of wafers W to be transported to the exposing machine EXP can be adjusted simply in the IF section 5.

(5) The foregoing embodiment may be further modified to stop loading wafers W from the ID section 1 into the treating section 3 when the wafers W currently placed in the buffers BF exceed a predetermined number. If the buffers BF were unable to receive any further wafers W, it would be impossible to feed wafers W smoothly from the treating section 3 to the IF section 5. If wafers W were loaded into the treating section 3 under such circumstances, variations would occur with wafers W in the time taken from loading into the treating section 3 to feeding from the treating section 3, resulting in deterioration in the quality of treatment of the wafers W, for example. However, according to this modification, loading of wafers W from the ID section 1 into the treating section 3 is stopped when the wafers W placed in the buffers BF exceed a predetermined number. Thus, the deterioration in the quality of treatment of the wafers W noted above can be precluded.

(6) In the foregoing embodiment, IF transport mechanisms $T_{IF}$ have been described as including the first transport mechanism $T_{IFA}$ and the second transport mechanism $T_{IFB}$. The invention is not limited to this. It may be modified to provide one transport mechanism or three or more transport mechanisms.

(7) In the foregoing embodiment, wafers W loaded from the ID section 1 into the treating section 3 are distributed alternately to the stories K1 and K3. A method of distribution may be varied and selected as appropriate. For example, wafers W loaded from the ID section 1 into the treating section 3 may be distributed in units of two or more to the substrate treatment lines L. The ratio of wafers W transported to the substrate treatment lines L may be made equal or different between the substrate treatment lines L.

(8) In the foregoing embodiment, it has been described that, even when a wafer W placed in a buffer BF is determined to be the next one to be transported to the exposing machine EXP, if a wafer W is being fed from either substrate treatment line L, it is preferable to give priority to receipt of the wafer W fed from the substrate treatment line L. The invention is not limited to this. Priority may be given to the operation to transport the wafer W placed in the buffer BF to the exposing machine EXP.

(9) The foregoing embodiment provides two substrate treatment lines L, but the invention not limited to this. The construction may be modified to include three or more substrate treatment lines L vertically arranged in multiple stages.

(10) In the foregoing embodiment, the substrate treatment lines L are arranged one over the other, but the invention is not limited to this. For example, a plurality of substrate treatment lines may be arranged sideways or horizontally. Or a plurality of substrate treatment lines may be arranged sideways as well as vertically.

(11) In the foregoing embodiment, the treating section 3 is formed of two treating blocks Ba and Bb arranged in juxtaposition, but the invention not limited to this. For example the treating section 3 may be formed of a single block, or three or more blocks. A single treating block providing the substrate treatment line Lu and a single treating block providing the substrate treatment line Ld may be arranged one over the other.

(12) In the foregoing embodiment, the substrate treatment lines L carry out the treatment for forming resist film and antireflection film on the wafers W, as well as the post-exposure baking (PEB) treatment and developing treatment. The substrate treatment lines L may be modified to perform other treatment such as cleaning of the wafers W. Accordingly, the type, number and the like of treating units are selected or designed as appropriate.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating substrates in a substrate treating apparatus having an indexer section, a treating section and an interface section, said method comprising:
   a first step for loading the substrates from the indexer section into the treating section;
   a second step for treating the substrates in parallel through a plurality of substrate treatment lines provided for the treating section; and
   a third step executed in the interface section for receiving the substrates fed from the substrate treatment lines, adjusting the substrates received to an order in which the substrates are loaded into the treating section, and transporting the substrates to an exposing machine provided separately from the apparatus in the order in which the substrates are loaded into the treating section,
   wherein the third step is executed,
      when a substrate fed from one of the substrate treatment lines to the interface section is different from a next substrate to be transported to the exposing machine, to place the substrate in a buffer unit and thereafter to transport the substrate to the exposing machine; and
      when the substrate fed from the one of the substrate treatment lines to the interface section is the next substrate to be transported to the exposing machine, to transport the substrate to the exposing machine without placing the substrate in the buffer unit.

2. The method according to claim 1, wherein the third step is executed, when the substrate placed in the buffer unit becomes the next substrate to be transported to the exposing machine, to transport the substrate placed in the buffer unit to the exposing machine.

3. The method according to claim 1,
   wherein the third step is executed, when a substrate is fed from one of the substrate treatment lines by first receiving the substrate fed from the one of the substrate treatment lines, and thereafter transporting the substrate placed in the buffer unit to the exposing machine, even when the substrate placed in the buffer unit becomes the next substrate to be transported to the exposing machine.

4. The method according to claim 1, wherein the second step is executed to form resist film on the substrates.

5. The method according to claim 1, wherein:
   the substrate treatment lines are arranged one over another,
   each of the substrate treatment lines treats the substrates while transporting the substrates substantially horizontally,
   each of the substrate treatment lines includes:
      treating units for treating the substrates; and
      main transport mechanisms for transporting the substrates to and from the treating units; and
      treatments carried out in the substrate treatment lines are identical.

6. The method according to claim 1, wherein:
   the third step is executed to determine the order in which the substrates are loaded into the treating section by referring to relationship information;
   the relationship information including:
      the order in which the substrates are loaded into the treating section; and
      substrate identifying information;
   the relationship information having the substrate identifying information selectively matched with the order in which the substrates are loaded into the treating section.

7. The method according to claim 1, wherein:
   the third step is executed to determine the order in which the substrates are loaded into the treating section by referring to relationship information;
   the relationship information including:
      the order in which the substrates are loaded into the treating section; and
      information for identifying the substrate treatment lines;
   the relationship information having the information for identifying the substrate treatment lines selectively matched with the order in which the substrates are loaded into the treating section.

8. The method according to claim 1 wherein the third step is executed to stop loading the substrates from the indexer section into the treating section when the substrates placed in the buffer unit exceed a predetermined number.

9. The method according to claim 1 wherein the first step is executed to distribute each of the substrates loaded into the treating section regularly to one of the substrate treatment lines.

10. The method according to claim 1 wherein:
    the buffer unit is disposed in the interface section; and
    the third step is executed to change positions of the substrates placed in the buffer unit according to the substrate treatment lines from which the substrates are fed.

11. The method according to claim 1 further comprising a fourth step executed in the interface section for receiving the substrates fed from the exposing machine, and transporting the substrates received to the substrate treatment lines selectively.

12. The method according to claim 11 wherein the fourth step is executed to transport the substrates fed from the exposing machine to the substrate treatment lines which have treated the substrates in the second step.

13. The method according to claim 11 further comprising a fifth step executed in the substrate treatment lines for treating in parallel the substrates loaded from the interface section into the treating section.

14. The method according to claim 13 wherein the fifth step is executed to develop the substrates.

15. The method according to claim 13 further comprising a sixth step for transporting the substrates from the treating section to the indexer section.

* * * * *